United States Patent
Heliö et al.

(10) Patent No.: US 9,379,729 B2
(45) Date of Patent: Jun. 28, 2016

(54) RESISTIVE/RESIDUE CHARGE-TO-DIGITAL TIMER

(71) Applicants: Petri Heliö, Tampere (FI); Johannes Petrus Antonius Frambach, Nijmegen (NL); Petri Korpi, Kangasala (FI); Paavo Väänänen, Nokia (FI)

(72) Inventors: Petri Heliö, Tampere (FI); Johannes Petrus Antonius Frambach, Nijmegen (NL); Petri Korpi, Kangasala (FI); Paavo Väänänen, Nokia (FI)

(73) Assignee: ST-Ericsson SA, Plan-les-Ouates (CH)

( * ) Notice: Subject to any disclaimer, the term of this patent is extended or adjusted under 35 U.S.C. 154(b) by 521 days.

(21) Appl. No.: 13/724,182

(22) Filed: Dec. 21, 2012

(65) Prior Publication Data

US 2013/0169457 A1 Jul. 4, 2013

Related U.S. Application Data

(63) Continuation-in-part of application No. 13/338,390, filed on Dec. 28, 2011, now Pat. No. 8,659,360, and a continuation-in-part of application No. 13/338,550, filed on Dec. 28, 2011, now Pat. No. 8,618,965.

(60) Provisional application No. 61/580,813, filed on Dec. 28, 2011.

(51) Int. Cl.
*H03M 1/50* (2006.01)
*H03M 1/12* (2006.01)
(Continued)

(52) U.S. Cl.
CPC ............ *H03M 1/12* (2013.01); *G04F 10/105* (2013.01); *H03M 1/1009* (2013.01); *G04F 10/005* (2013.01)

(58) Field of Classification Search
CPC .................. H03M 1/1009; H03M 1/502
USPC .......... 341/144, 111, 166, 157, 118, 120, 143
See application file for complete search history.

(56) References Cited

U.S. PATENT DOCUMENTS 5,617,062 A * 4/1997 O'Shaughnessy et al. ... 331/111
5,886,660 A * 3/1999 Loewenstein ................. 341/166
(Continued)

FOREIGN PATENT DOCUMENTS

DE 3834938 C1 12/1989
EP 0662650 A2 7/1995
(Continued)

OTHER PUBLICATIONS

Staszewski, R. B., et al., "All-Digital TX Frequency Synthesizer and Discrete-Time Receiver for Bluetooth Radio in 130-nm CMOS", IEEE Journal of Solid-State Circuits, Dec. 1, 2004, pp. 2278-2291, vol. 39, Issue 12, IEEE Solid-State Circuits Society.
(Continued)

*Primary Examiner* — Peguy Jean Pierre
(74) *Attorney, Agent, or Firm* — Coats & Bennett, PLLC

(57) ABSTRACT

A resistive/residual Charge to Digital Timer (RCDT) provides efficient, accurate measurement of short time delay between two signals, by converting the time delay to current, and measuring the charge integrated by a capacitor over a duration. In one embodiment, in quantizing this charge (measured as voltage), a residual charge is maintained cycle-to-cycle. This allows for implementation of a Noise shaping Charge to Digital Timer (NCDT), providing improved resolution over a plurality of measurement cycles. The RCDT/NCDT is particularly (but not exclusively) well suited for phase error detection in a Digital Phase Locked Loop.

35 Claims, 18 Drawing Sheets

(51) Int. Cl.
  *H03M 1/10* (2006.01)
  *G04F 10/10* (2006.01)
  *G04F 10/00* (2006.01)

(56) References Cited

U.S. PATENT DOCUMENTS

| | | | |
|---|---|---|---|
| 6,756,699 | B2 | 6/2004 | Hartmann et al. |
| 6,850,102 | B2 | 2/2005 | Hsu et al. |
| 6,870,411 | B2 | 3/2005 | Shibahara et al. |
| 7,095,287 | B2 | 8/2006 | Maxim et al. |
| 7,609,756 | B2 | 10/2009 | Wood |
| 7,667,633 | B2 | 2/2010 | Choi et al. |
| 7,791,428 | B2 * | 9/2010 | Chang et al. ............ 332/123 |
| 7,977,954 | B2 * | 7/2011 | Reynolds et al. ........ 324/678 |
| 8,363,033 | B2 | 1/2013 | Chen et al. |
| 2006/0017603 | A1 | 1/2006 | Demirdag et al. |
| 2006/0121858 | A1 | 6/2006 | Tanaka et al. |
| 2009/0072911 | A1 | 3/2009 | Ke et al. |
| 2009/0289606 | A1 * | 11/2009 | Lauxtermann et al. ...... 320/166 |
| 2010/0238057 | A1 | 9/2010 | Wood |
| 2010/0244971 | A1 | 9/2010 | Wang et al. |
| 2013/0169327 | A1 | 7/2013 | Heliö et al. |
| 2013/0169455 | A1 | 7/2013 | Heliö et al. |

FOREIGN PATENT DOCUMENTS

| | | |
|---|---|---|
| EP | 2388923 A1 | 11/2011 |
| FR | 2224759 A1 | 10/1974 |
| WO | 2008088986 A2 | 7/2008 |

OTHER PUBLICATIONS

Dawson, J. W., et al., "Fast TDC for On-line TOF Using Monolithic Flash A/D Converter", IEEE Transactions on Nuclear Science, Feb. 1, 1981, pp. 610-612, vol. NS-28, No. 1, IEEE.

Napolitano, P., et al., "A Novel Sample-and-Hold-Based Time-to-Digital Converter Architecture", IEEE Transactions on Instrumentation and Measurement, May 1, 2010, pp. 1019-1026, vol. 59, Issue 5, IEEE Instrumentation and Measurement Society.

Staszewski, R. B., et al., "Time-to-Digital Converter for RF Frequency Synthesis in 90 nm CMOS", Radio Frequency integrated Circuits (RFIC) Symposium, Digest of Papers, Jun. 12, 2005, pp. 473-476, IEEE.

Hsu, C-M., et al., "A Low-Noise Wide-BW 3.6-GHz Digital $\Delta\Sigma$ Fractional-N Frequency Synthesizer With a Noise-Shaping Time-to-Digital Converter and Quantization Noise Cancellation", IEEE Journal of Solid-State Circuits, Dec. 1, 2008, pp. 2276-2786, vol. 43, No. 12, IEEE.

Galton, I., "Analog-Input Digital Phase-Locked Loops for Precise Frequency and Phase Demodulation", IEEE Transactions on Circuits and Systems—II: Analog and Digital Signal Processing, Oct. 1, 1995, pp. 621-630, vol. 42, No. 10, IEEE.

\* cited by examiner

RESISTIVE/RESIDUE CHARGE-TO-DIGITAL TIMER

This application claims priority to U.S. Provisional Patent Application Ser. No. 61/580,813, filed Dec. 28, 2011, titled "Resistive/Residue Charge-to-Digital Timer," assigned to the assignee of the present application and incorporated herein by reference in its entirety.

This application is a Continuation-in-Part of U.S. patent application Ser. No. 13/338,390, filed Dec. 28, 2011, titled "Charge-to-Digital Timer," which issued as U.S. Pat. No. 8,659,360 on Feb. 25, 2014, and which is assigned to the assignee of the present application and incorporated herein by reference in its entirety.

This application is a Continuation-in-Part of U.S. patent application Ser. No. 13/338,550, filed Dec. 28, 2011, titled "Calibration of a Charge-to-Digital Timer," which issued as U.S. Pat. No. 8,618,965 on Dec. 31, 2013, and which is assigned to the assignee of the present application and incorporated herein by reference in its entirety.

TECHNICAL FIELD

The present invention relates generally to time-to-digital converters that estimate a time difference between two signals, and in particular to a charge-to-digital timer that implements noise shaping by retention of residual charge.

BACKGROUND

Radio Frequency (RF) transmission and reception is central to many modern consumer electronics devices, industrial control systems, communications systems, navigation systems, and the like. One of the key building blocks found in most radio transceivers is a (variable) frequency synthesizer, often implemented as a Phase Locked Loop (PLL). The frequency synthesizer produces an RF output signal with a stable frequency, as compared to a reference frequency source, such as a crystal oscillator. One important application for a frequency synthesizer is use as the local oscillator (LO) in a receiver or transmitter to implement frequency conversion, e.g. of a received signal from RF to baseband, or vice versa for a signal to be transmitted.

Conventionally, PLLs have been implemented in analog domain, with a prescaler, an analog phase detector, a charge pump and an analog loop filter to adjust a Voltage Controlled Oscillator (VCO) to a desired output frequency.

FIG. 1 shows a basic topology of Digital Phase-Locked Loop (DPLL) 10. The DPLL 10 includes a Digital Phase Detection and Filtering block 12, a Digitally Controlled Oscillator (DCO) 14, a Time to Digital Conversion (TDC) block 16, and a reference frequency source 18. The TDC 16 is a quantized phase detector, which detects a phase difference between the output of the DCO 14 and the reference frequency source 18. The quantized phase is compared to a digital reference, i.e., frequency control word (FCW), to form a phase error signal. The phase error is then filtered by a digital loop filter, and used to adjust the DCO 14. Since the reference oscillator 18 defines the sampling rate and time instant at which the DCO 14 output signal is measured, the DCO 14 output frequency will be equal to the reference frequency multiplied by FCW.

The TDC 16 used to quantize the phase difference between the reference clock edge and the DCO edge, must have a fine grain resolution. The DPLL 10 in-band phase noise level is directly proportional to the TDC 16 quantization step. Common implementations of a TDC 16 circuit are based on delay lines, with numerous taps. The resolution is limited to the minimum gate delay available in the implementation technology (e.g., approximately 25 ps in deep sub-micron CMOS). Using delay difference, instead of unit delay, the resolution can be enhanced (known as the Vernier principle). Still, resolution is limited due to analog impairments (e.g. delay mismatch) prohibiting reliable delay difference below 5 ps. State of the art is limited to the range of 5 ps, prohibiting DPLL in-band phase noise floor less than −100 dBc at GHz frequencies.

In addition to achieving limited phase quantization resolution, the delay line based TDCs 16 include numerous circuit components, and are fully analog in design. As well known in the art, analog circuits are challenging to implement in new projects. They also often exhibit a current consumption profile that is difficult to manage, with high peak values.

Prior art TDC 16 solutions rely on using delay line based phase quantization. If the delay is fixed, the quantization noise will rise as function of the DCO 14 output frequency. The number of bits obtained from the TDC 16 can be directly evaluated by $$\log_2\left(\frac{1}{T_d \cdot F_{DCO}}\right),$$

where $T_d$ represents the delay, i.e. the time measurement resolution, and $F_{DCO}$ represents the frequency of the DCO 14.

Delay may be adjusted relative to $F_{DCO}$, but in practice this entails an increase in power dissipation as the frequency rises. Increased power dissipation exacerbates clock interference caused by the TDC 16, which may disturb the operation of the DPLL 10. Delay cells create high peak supply currents, and thus it is difficult to maintain the supply voltage of the TDC 16 constant. If the supply voltage varies, it will further modulate the TDC 16 measurement result, and cause unwanted modulation of the DCO 14. The modulation is also channel dependent, which makes it difficult to accurately characterize the phase quantization device. Thus, it is also difficult to implement automated digital algorithms and software calibrations to optimize and remove unwanted components from the output signal.

One example of DPLL implementation using delay line for phase quantization is described in a paper by R. B. Staszewski et al., titled, "All-Digital TX Frequency Synthesizer and Discrete-Time Receiver for Bluetooth Radio in 130-nm CMOS," published in the *IEEE Journal of Solid-State Circuits*, Vol. 39, No. 12, pp. 2278-2279, December 2004, the disclosure of which is incorporated herein by reference in its entirety.

The Background section of this document is provided to place embodiments of the present invention in technological and operational context, to assist those of skill in the art in understanding their scope and utility. Unless explicitly identified as such, no statement herein is admitted to be prior art merely by its inclusion in the Background section.

SUMMARY

The following presents a simplified summary of the disclosure in order to provide a basic understanding to those of skill in the art. This summary is not an extensive overview of the disclosure and is not intended to identify key/critical elements of embodiments of the invention or delineate the scope of the invention. The sole purpose of this summary is to present some concepts disclosed herein in a simplified form as a prelude to the more detailed description that is presented later.

According to one or more embodiments disclosed and claimed herein, a time domain measurement is achieved by performing a voltage domain measurement. The transfer from the time domain to the voltage domain is done by integrating a fixed current into a fixed capacitor through a fixed resistor over the time period to be measured (Tstop−Tstart), resulting in a definitive amount of charge stored in the capacitor; the charge results in a definitive voltage across the capacitor. Variable time yields variable voltage. This is known as a Charge to Digital Timer (CDT) type of TDC 16. Phase difference (time difference) is converted into charge, which can be measured by the voltage across the integration capacitor.

The voltage in a CDT may be converted into the digital domain with a ramping ADC, which approximates the voltage by successive subtraction of unit charge quanta (linear approximation), until a threshold is reached (e.g., capacitor empty). The number of subtracted quanta represents the quantized phase difference. This data, phaseF or the fractional phase, is the digital output of the CDT. Such a CDT requires a very linear current source for correct time-to-charge conversion and exactly matched unit capacitors in the ramping ADC.

According to embodiments of the present invention, the voltage across an integration capacitor is measured by means of switched capacitor configuration. Instead of emptying the integration capacitor by linear subtraction of charge quanta, a constant fraction of the charge is removed from the main capacitor every cycle. This results in exponential curve, similar to an RC-discharge. The principle is based on charge sharing, and the fraction of charge removed from the integration capacitor in each cycle is simply the ratio of the switched capacitor to the integration capacitor. Due to the RC-discharge shape of this method, it is not required that the charging of the integration capacitor be done with a very linear current during the measurement interval. Rather, the integration capacitor may be charged through a resistor, which is a much simpler charging circuit. The two RC-shapes (i.e., the charge and discharge curves of the integration capacitor) will cancel each other, resulting in a perfectly linear transfer function. This type of CDT circuit is referred to herein as a Resistive Charge to Digital Timer (RCDT).

Normally, in CDT circuits, the integration capacitor is reset after the measurement. According to embodiments of the present invention, a charge residue is maintained in the integration capacitor between measurements, and the quantization error is integrated over time. This type of CDT circuit is referred to herein as a Residue Charge to Digital Timer (also RCDT). The retention of residual charge enables a form of noise shaping. Noise shaping is a well-known technique (e.g., in audio processing circuits) for enhancing resolution within a frequency band of interest, by pushing quantization errors outside of that band. Noise shaping cannot be done in the time domain; hence transferring time to charge, and charge to voltage, is necessary to implement noise shaping. An RCDT implementing noise shaping is referred to herein as a Noise Shaping Charge to Digital Timer (NCDT). The noise shaping feature of embodiments of the present invention allow an NCDT to achieve femto second (<<1 pico second) resolution with simple circuits. Such NCDT circuits are suitable for use in ultra high performance DPLLs.

One embodiment relates to a method of measuring the elapsed time between a START event and a later STOP event. A load voltage across an integration capacitance is compared to a predetermined reference voltage. Beginning at the START event, the integration capacitance is continuously discharged through a resistor for an analog discharge duration lasting at least until the STOP event to reduce the load voltage. Following the analog discharge duration, the integration capacitance is discharged in a plurality of discrete discharge cycles via a digitally switched capacitance that is a predetermined fraction of the integration capacitance, to further reduce the load voltage, until the load voltage is equal to or less than the reference voltage. The number of discrete discharge cycles is counted. The integration capacitance is continuously charged through the resistor for a predetermined analog charging duration, greater than the analog discharge duration, to increase the load voltage. The elapsed time is determined from the number of discrete discharge cycles.

Another embodiment relates to a Noise Shaping Charge to Digital Timer circuit operative to measure the elapsed time between a START event and a later STOP event. The circuit includes an integration capacitor having a load voltage across it, and a resistor in series with the integration capacitor. The circuit also includes a digitally switched capacitor which is a predetermined fraction of the integration capacitance, and a comparator operative to compare the load voltage to a reference voltage. The circuit further includes a controller operative to, beginning at the START event, continuously discharge the integration capacitor through the resistor for an analog discharge duration lasting at least until the STOP event to reduce the load voltage; following the analog discharge duration, discharge the integration capacitor in a plurality of discrete discharge cycles via the digitally switched capacitor, to further reduce the load voltage, until the load voltage is equal to or less than the reference voltage; count the number of discrete discharge cycles; continuously charge the integration capacitor through the resistor for a predetermined analog charging duration, greater than the analog discharge duration, to increase the load voltage; and determine the elapsed time from the number of discrete discharge cycles.

DETAILED DESCRIPTION

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
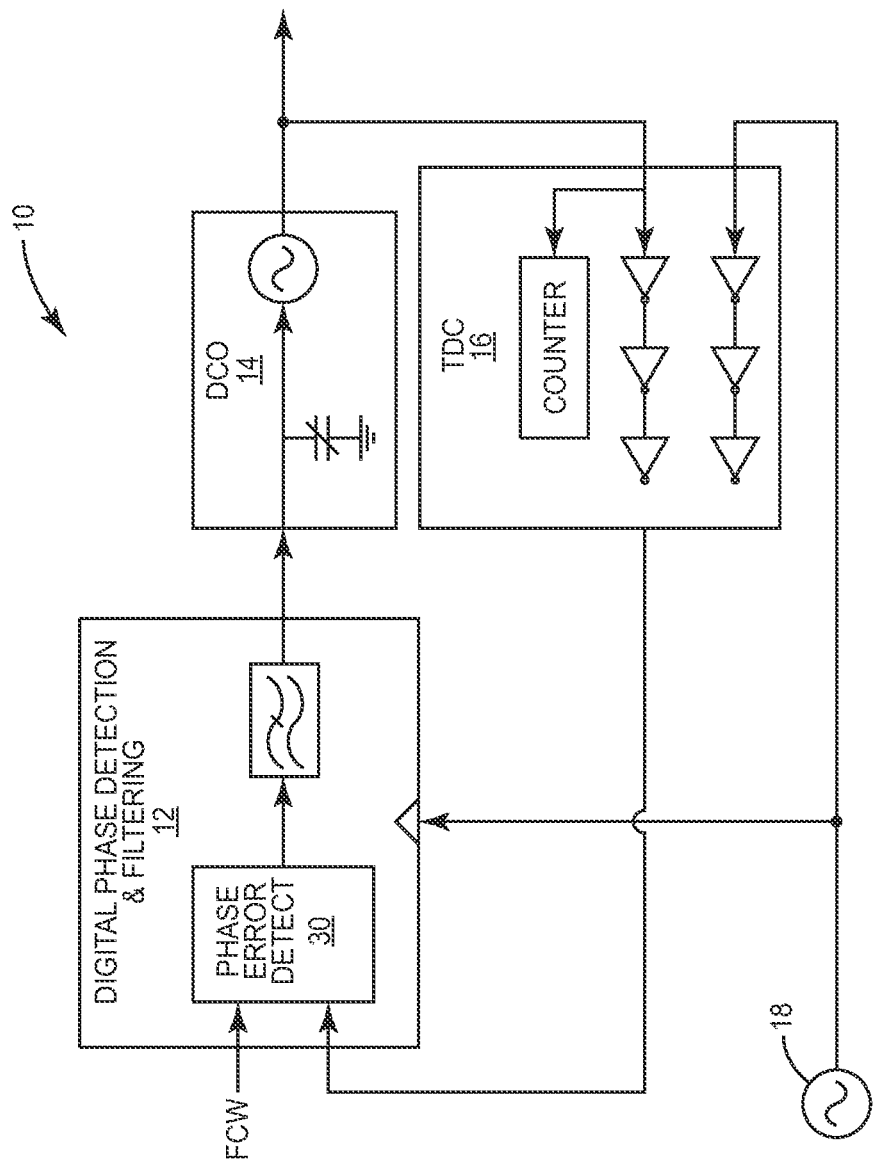
FIG. 1 is a functional block diagram of a Digital Phase-Locked Loop (DPLL) utilizing a Time-to-Digital-Conversion as a quantized phase detector.
Figure 2:
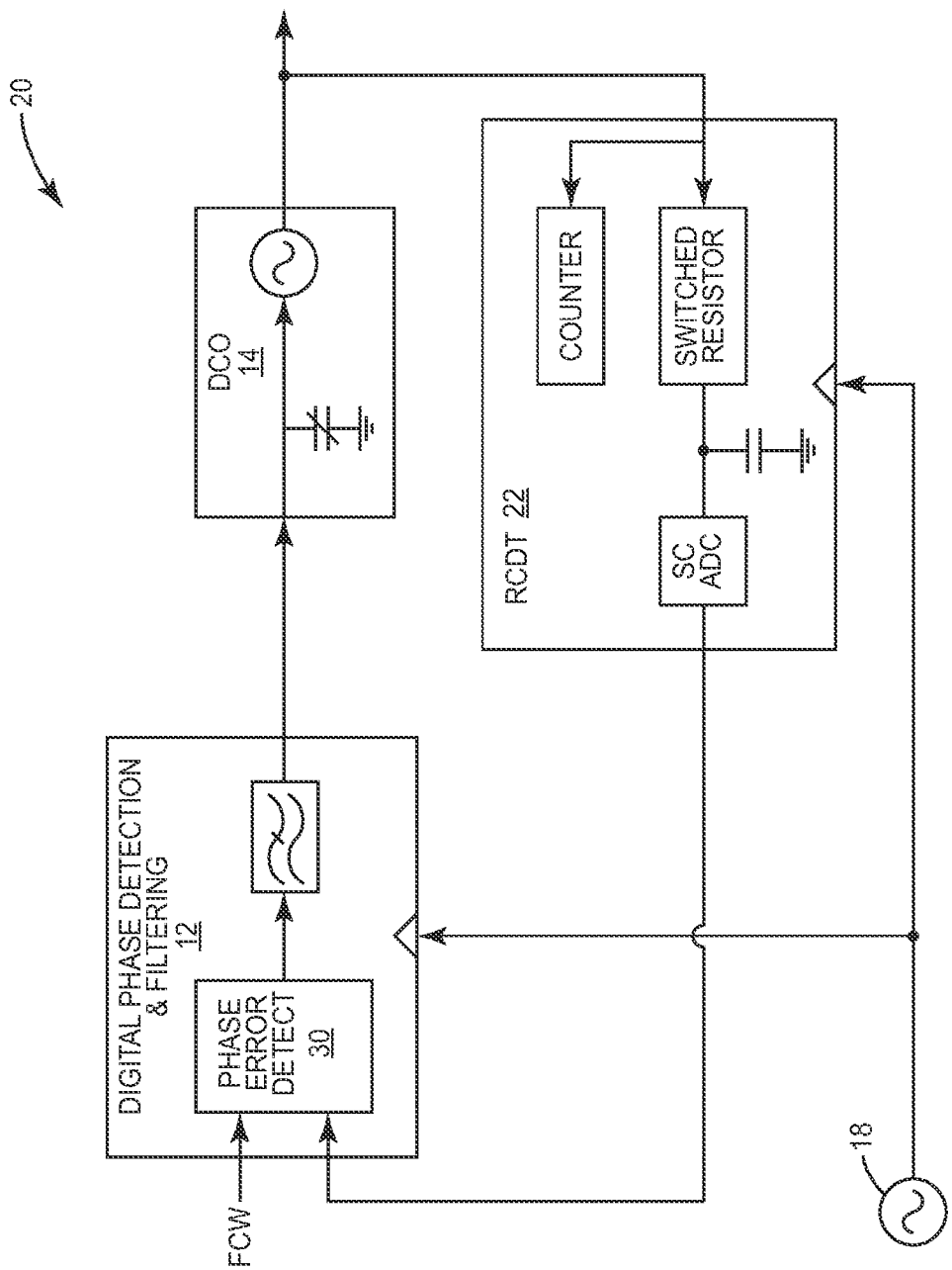
FIG. 2 is a functional block diagram of a DPLL utilizing a Resistive/Residue Charge-to-Digital Timer (RCDT) for phase error detection.

FIG. 2 depicts a DPLL 20. Similarly to the DPLL 10 of FIG. 1, the DPLL 20 includes a Digital Phase Detection and Filtering block 12, a Digitally Controlled Oscillator (DCO) 14, and a reference frequency source 18. However, in lieu of the delay based TDC 16 of FIG. 1, the DPLL 20 includes a Resistive/Residue Charge-to-Digital Timer (RCDT) 22 to detect a phase difference between the output of the DCO 14 the reference frequency source 18. The RCDT 22 includes tuning methods for achieving low phase quantization noise over the frequency range of the DPLL 20.

The methods and circuits of the RCDT 22 overcome numerous problems associated with delay line based phase measurement, such as the TDC 14 of FIG. 1. In particular, delay cell based TDCs 14 have limited quantization resolution. Resolution is limited by the minimum achievable unit delay and by the matching of unit delays. Delay cell based TDCs 14 that manage to achieve finer resolutions are generally complex and analog intensive (see Staszewski, et al.).

In the RCDT 22, the delay line based phase quantization is replaced by charge based phase quantization, and easily controllable analog parameters are used for tuning the phase quantization accuracy over the required DCO 14 output frequency range. This provides means to adjust the quantization resolution automatically over a large frequency range.

Figure 3:
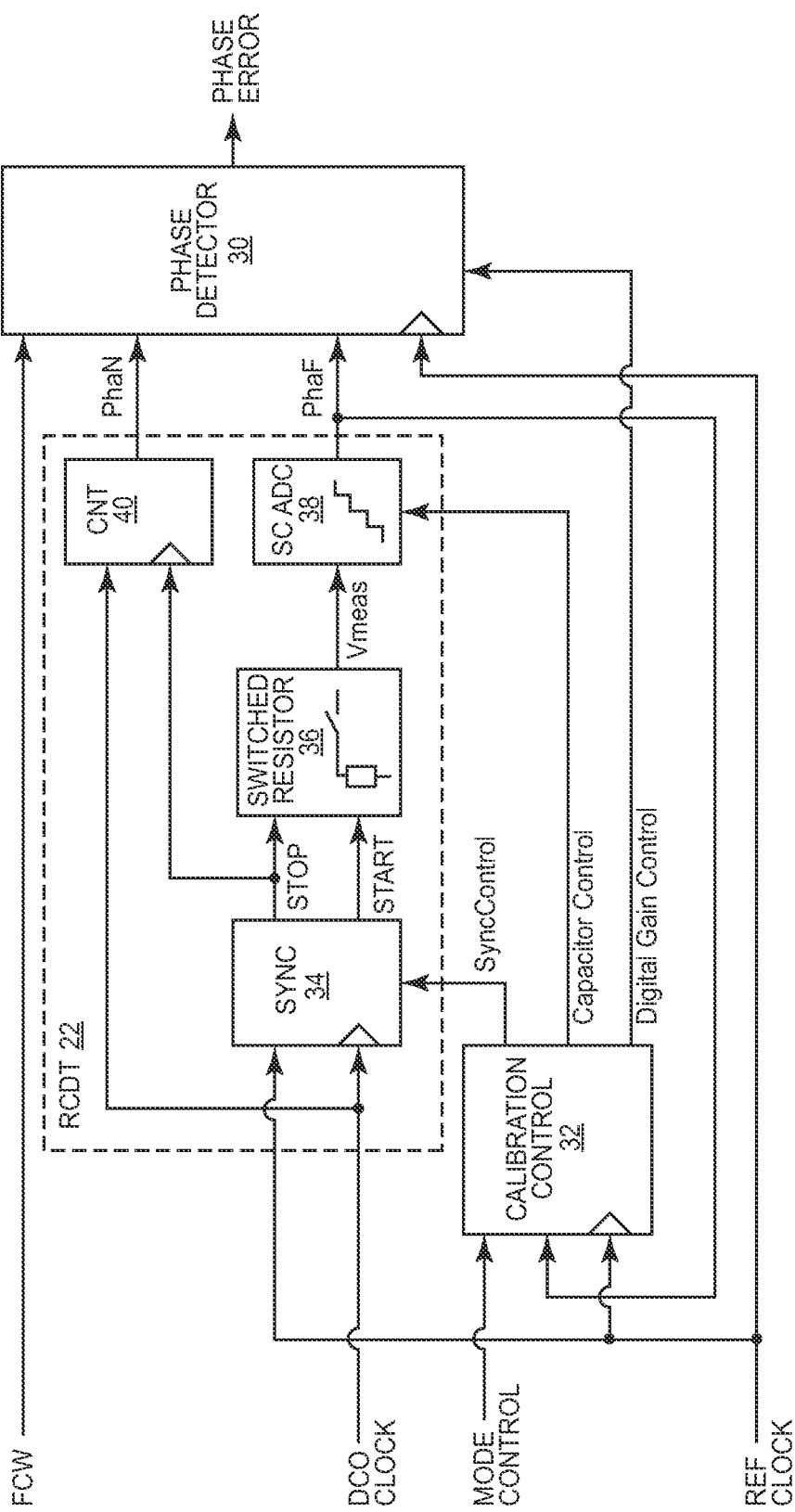
FIG. 3 is a functional block diagram of a phase detector in a DPLL utilizing a RCDT.

FIG. 3 depicts some of the functional blocks involved in phase detection and phase detection auto-calibration. A Calibration Control block 32 sequences the Phase Error measurement according to a Mode Control signal. The RCDT 22 is used to measure the time difference, in this embodiment, between the REF Clock from the reference frequency source 18 and DCO Clock, or the output of the DCO 14.

The RCDT block 22 includes a Sync block 34, Switched Resistor circuit 36, Switched Capacitor (SC) ADC 38, and a Counter 40. The Sync block 34 generates START and STOP signals for the time measurement. In this embodiment, START and STOP signals are defined according to REF Clock and DCO Clock, respectively. START and STOP signals are also used to generate a measurement voltage Vmeas for the SC ADC 38. Vmeas is proportional to the time difference (also referred to as the phase difference or phase error)

between the REF Clock and DCO Clock. The STOP signal is further used to trigger the count from the Counter 40.

The Digital Phase Detector 30 has four inputs: Frequency control word FCW for programming the channel; the integer part of the measured phase PhaN, which is received from the Counter 40; the fractional part of the measured phase error PhaF, which is received from the SC ADC 38; and a Digital Gain control signal from the Calibration Control block 32 for controlling the scaling of PhaF measurement result during closed loop operation.

The Phase Detector 30 calculates the first time difference of the measured integer phase error PhaN ($\Phi_N$) and fractional phase-error PhaF ($\Phi_F$) in order to remove an average data offset that is present in PhaF measurement result. After taking the first time difference of $\Phi_F$, the result is scaled to the word length that is used for frequency control word (FCW) fractional part. After scaling, the integer and fractional parts are summed, a frequency error signal is formed by comparing the measurement result to programmed reference, i.e. the frequency control word (FCW).

It is important to have accurate auto-calibration for the scaling factor in order to achieve good performance. The scaling factor can be tuned (calibrated) by tuning either the analog part (the switched resistor circuit 36 and SC ADC 38) conversion gain, or the digital gain. When the analog part is tuned, the measurement resolution is tuned to have an effect on the quantization noise. The digital gain scaling is simply a multiplication for scaling the data into a suitable word length. Any error between calibrated conversion resolution and digital scaling values will cause inaccurate feedback gain, and therefore has an effect on noise and spurious components in the output of the DPLL 20.

The frequency error signal is then integrated to convert back to the phase domain before filtering. The integrator can have two modes: trapezoidal accumulator or normal accumulator. In the first case, the integrator transfer function will have notch in half of the sample frequency. The notch may become useful if the reference frequency and desired channel are selected in such a way that phase detection tends to create a spurious modulating of the DCO on that offset. The integrator can be zeroed in order to guarantee proper start-up state during the settling.

The Phase Detector 30 functionality can be presented with the z-domain description presented in Equation (1), when the notch is enabled. $F_{scale}$ is the scaling factor that is dependent on the calibration control signal Digital Gain Control.

$$\Phi_\varepsilon(z) = \qquad (1)$$
$$FCW - ((1-z^{-1}) \cdot \Phi_N(z) + (1-Z^{-1}) \cdot F_{scale} \cdot \Phi_F(z)) \cdot \frac{(1+z^{-1})}{2 \cdot (1-z^{-1})}$$

Operation of the RCDT 22 is described by following equations.

$$V_{rc}(T_{analog}) = V_{init} + V_{step}(1 - e^{-T_{analog}/R_{rc}C_{int}}) \qquad (2)$$

Equation (2) describes how the RC time constant filters the step voltage of size $V_{step}$. $V_{init}$ is the initial voltage just before a step. As time $T_{analog}$ progresses, $V_{rc}$ begins to load towards the $V_{step}$ voltage exponentially, with the slope of time constant $R_{rc}C_{int}$.

$$V_{sc}(T_{digital}) = V_{init} + V_{step}(1 - e^{-T_{digital}/R_{rc}C_{int}}) \qquad (3)$$

Similarly, equation (3) describes the step response for the switched capacitor circuitry, with Switched Capacitor (SC) resistor $R_{sc}$ instead of $R_{rc}$. Equation (3) is the same as (2), except that the continuous time resistor $R_{rc}$ is replaced by a discrete or digital time resistor $R_{sc}$, defined by equation (4):

$$R_{sc} = \frac{T_{step}}{C_{step}} \quad (4)$$

That is, the exponential charging behavior of RC is moved from the analog domain into the digital one when changing $R_{rc}$ to $R_{sc}$.

In the digital domain, the time $T_{digital}$ can also be expressed with a number N of discrete time steps, as in defined in equation (5):

$$T_{digital} = N \cdot T_{step} \quad (5)$$

This means that time in the digital domain ($T_{digital}$) is increased at every step (N) by the amount of $T_{step}$.

Substituting into equation (3) yields equation (6):

$$V_{sc}(N) = V_{init} + V_{step}(1 - e^{-N \cdot T_{step}/R_{rc}C_{int}})$$

$$V_{sc}(N) = V_{init} + V_{step}(1 - e^{-N \cdot R_{rc}C_{step}/R_{rc}C_{int}})$$

$$V_{sc}(N) = V_{init} + V_{step}(1 - e^{-N \cdot C_{step}/C_{int}}) \quad (6)$$

Comparison of equation (2) with equation (6) reveals that the voltage on a capacitance $C_{int}$ ramps in the analog time domain as $V_{rc}(T_{analog})$ and in the digital domain as $V_{sc}(N)$. These charge/discharge curves match when:

$$T_{analog} = N \cdot C_{step} \cdot R_{rc} \quad (7)$$

In other words, the analog time $T_{analog}$ can be sampled linearly with N discrete steps. The gain of the converter can be easily tuned with $C_{step}$ and $R_{rc}$. The relationship of equation (7) is exploited in a Time-to-Digital Converter (TDC).

Figure 4:
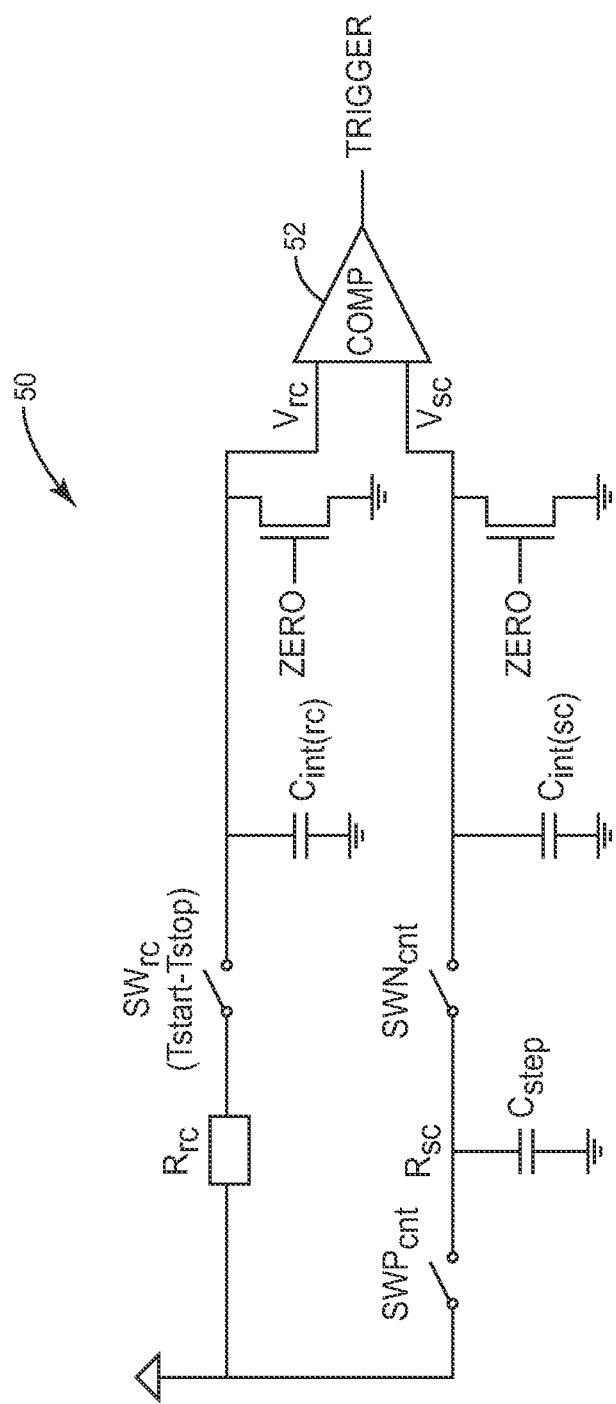
FIG. 4 is a circuit diagram of a RCDT according to one embodiment.

FIG. 4 depicts a RCDT circuit 50, according to one embodiment of the present invention. This circuit configuration assists the description of RC based time-to-digital conversion at a conceptual level, and also presents one possible implementation for RCDT 22.

A comparator 52 compares voltages $V_{rc}$ and $V_{sc}$. $V_{rc}$ is the voltage formed by the resistor $R_{rc}$ and analog domain integration capacitor $C_{int(rc)}$. A switch $SW_{rc}$ controls the RC loading time for $V_{rc}$. The switch $SW_{rc}$ is ON (closed) at $T_{start}$ and OFF (open) at $T_{stop}$. The difference is the time to be measured, $T_{meas} = T_{stop} - T_{start}$.

The voltage $V_{sc}$ is developed by switched-capacitor (SC) circuitry formed by switches $SWP_{cnt}$, $SWN_{cnt}$ and capacitors $C_{step}$ and $C_{int(sc)}$. $C_{int(sc)}$ is the digital domain integration capacitor (corresponding to $C_{int(rc)}$ in the analog domain), and $C_{step}$ is a switched capacitor used to charge $C_{int(rc)}$. $T_{start}$ is the period for switching the SC circuitry formed by $SWP_{cnt}$, $SWN_{cnt}$, and $C_{step}$. The switching frequency of the SC circuitry can be derived directly from $$F_{step} = \frac{1}{T_{step}}.$$

The switches $SWP_{cnt}$ and $SWN_{cnt}$ are preferably controlled by non-overlapping clock signals derived from same master clock ($CLK_{cnt}$). In a PLL application, $CLK_{cnt}$ may be the DCO signal running at RF frequency. Alternatively, separate ring oscillators can be used, as disclosed in the paper by Chun-Ming Hsu et al., titled, "A Low-Noise Wide-BW 3.6- GHz Digital ΔΣ Fractional-N Frequency Synthesizer With a Noise-Shaping Time-to-Digital Converter and Quantization Noise Cancellation," published in the *IEEE Journal of Solid-Sate Circuits*, Vol. 43, No. 12, pp. 2776-2786, December 2008, the disclosure of which is incorporated herein by reference in its entirety.

The TRIGGER output of the comparator is used to latch the state of a counter clocked by the counting clock $CLK_{cnt}$. This count represents the quantized time difference between $T_{start}$ and $T_{stop}$, which is the quantized or fractional phase, phaF. The system is zeroed before every measurement with ZERO signal, which fully discharges both integration capacitors $C_{int(rc)}$ and $C_{int(sc)}$.

Figure 5:
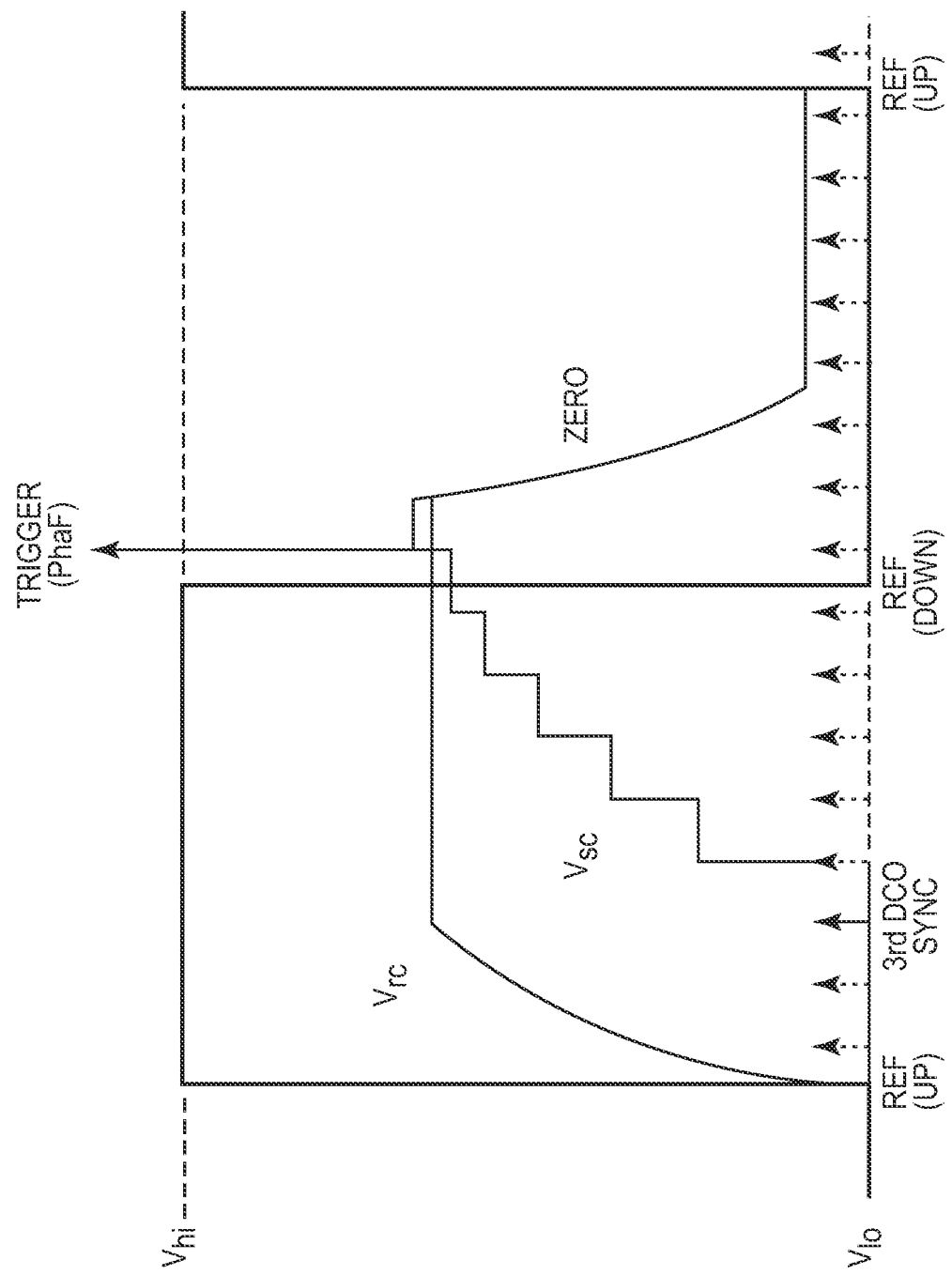
FIG. 5 is a graph of waveforms of the circuit of FIG. 4.

Operation of the RCDT circuit 50 is described with reference to the graphs of FIG. 5, depicting one conversion cycle. The measurement time, $T_{meas} = T_{stop} - T_{start}$, is the time from a rising edge of the reference clock REF(UP) to the 3$^{rd}$ following edge of the DCO clock. During this time, $V_{rc}$ is loaded exponentially up from low voltage ($V_{lo}$) towards a high voltage ($V_{hi}$) as the analog integration capacitor $C_{int(rc)}$ is charged through the resistor $R_{rc}$.

In the digital domain, the clock $CLK_{cnt}$ driving the switches $SWP_{cnt}$ and $SWN_{cnt}$ is derived directly from the DCO signal. Clocking of the SC circuit, as well as a counter (not shown) begins at the 4$^{th}$ DCO edge following the REF (UP) event. The voltage $V_{sc}$ on the digital domain integration capacitor $C_{int(sc)}$ increases—also exponentially—one step at every DCO clock edge. As soon as $V_{sc}$ reaches the voltage $V_{rc}$ across the analog domain integration capacitor $C_{int(rc)}$, the comparator 52 outputs a TRIGGER signal and number of clock $CLK_{cnt}$ cycles required to charge $C_{int(sc)}$ to this value is stored as the fractional phase, PhaF. The system is reset by asserting the ZERO signal, which discharges both integration capacitors, and readies the system for the next measurement at REF(UP).

Figure 6A:
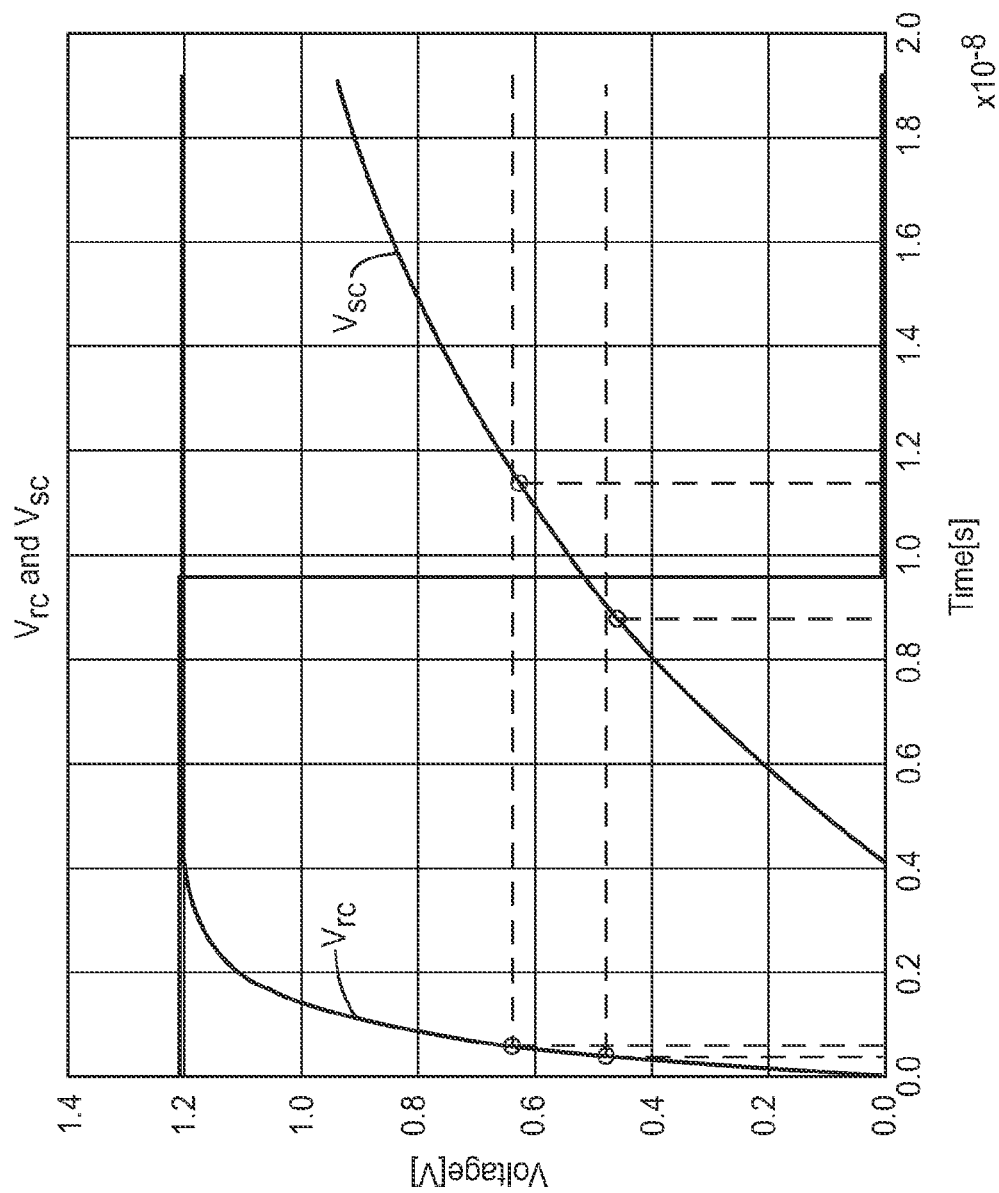
FIG. 6A is a graph of Vrc and Vsc for the circuit of FIG. 4.

FIG. 6A depicts $V_{rc}$ and $V_{sc}$ voltages for the RCDT circuit 50 of FIG. 4. The steep curve on the left is $V_{rc}$ and more gradual curve is $V_{sc}$. Minimum and maximum measured times are plotted with dashed lines. The vertical dashed lines at the far left are $V_{rc}$ measurement time (min/max) and the corresponding horizontal dashed lines) are $V_{rc}$ held voltage (min/max). The vertical dashed lines in center of the graph are $V_{sc}$ count in time base (min/max).

Figure 6B:
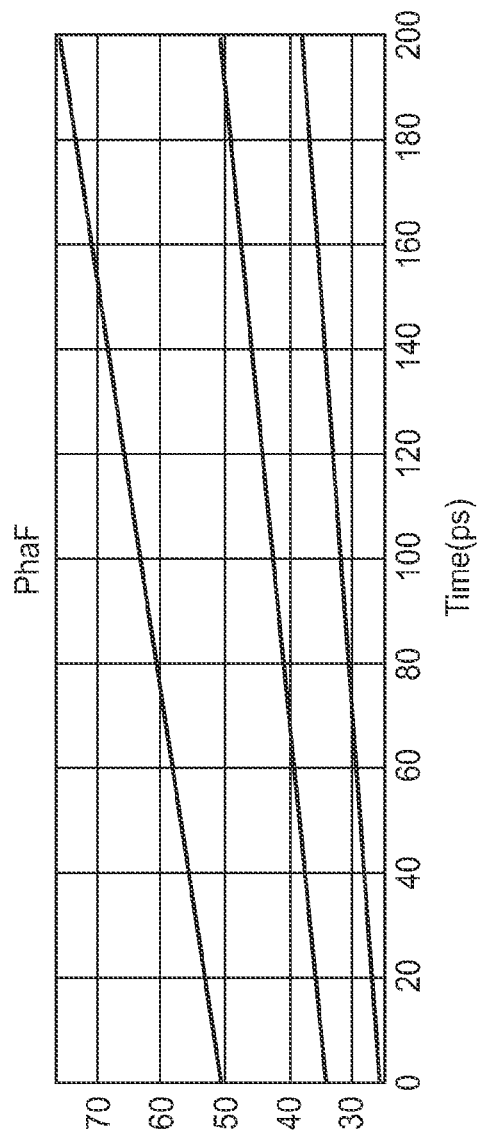
FIG. 6B depicts graphs of phase and error for the circuit of FIG. 4.
Figure 6B:
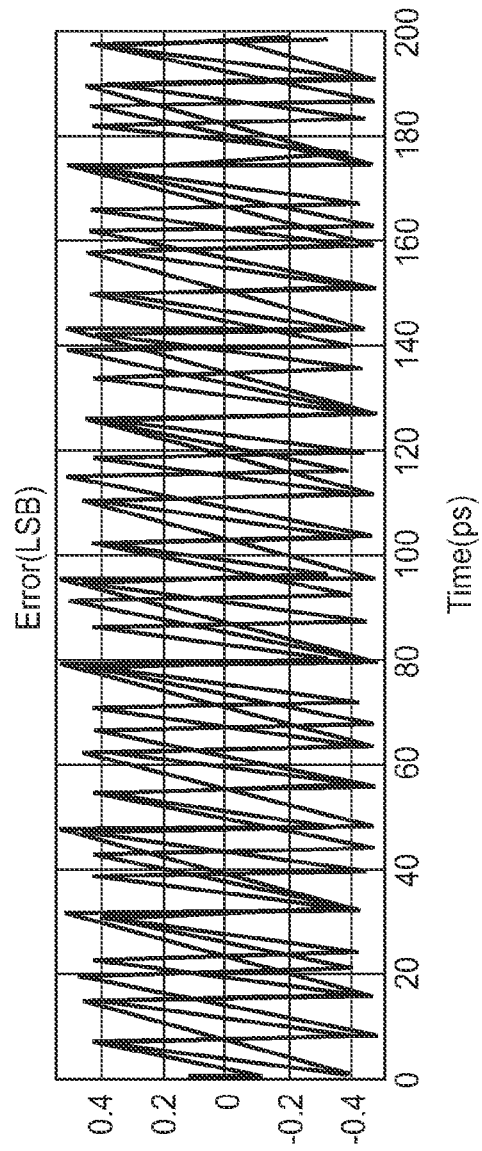

The upper graph of FIG. 6B depicts PhaF vs. $T_{meas}$ for the circuit 50 of FIG. 4. The projection of $V_{rc}$ in the analog domain on $V_{sc}$ in the digital domain is fully linear, because both charging curves are exponential. Also, the system 50 remains linear when components are tuned, such as $R_{rc}$. Changing $R_{rc}$ will effectively change the gain of the converter ($T_{meas}$ to PhaF). As depicted in the lower graph of FIG. 6B, the error (linearity) is kept <0.5 LSB in all tunings of $R_{rc}$, meaning that the system is fully linear.

Although circuit depicted in FIG. 4 is simple, has low parts count and a benign current signature without excessive spikes, the resolution is still limited to the minimal fraction of charge that can practically be added to the digital domain integration capacitor $C_{int(sc)}$ in one cycle. As such, the expected resolution is comparable to delay based TDC circuits, and is hence limited to a few pico seconds per step.

According to one embodiment of the present invention, noise shaping is added to the basic circuit 50 of FIG. 4, to greatly enhance the resolution.

Figure 7:
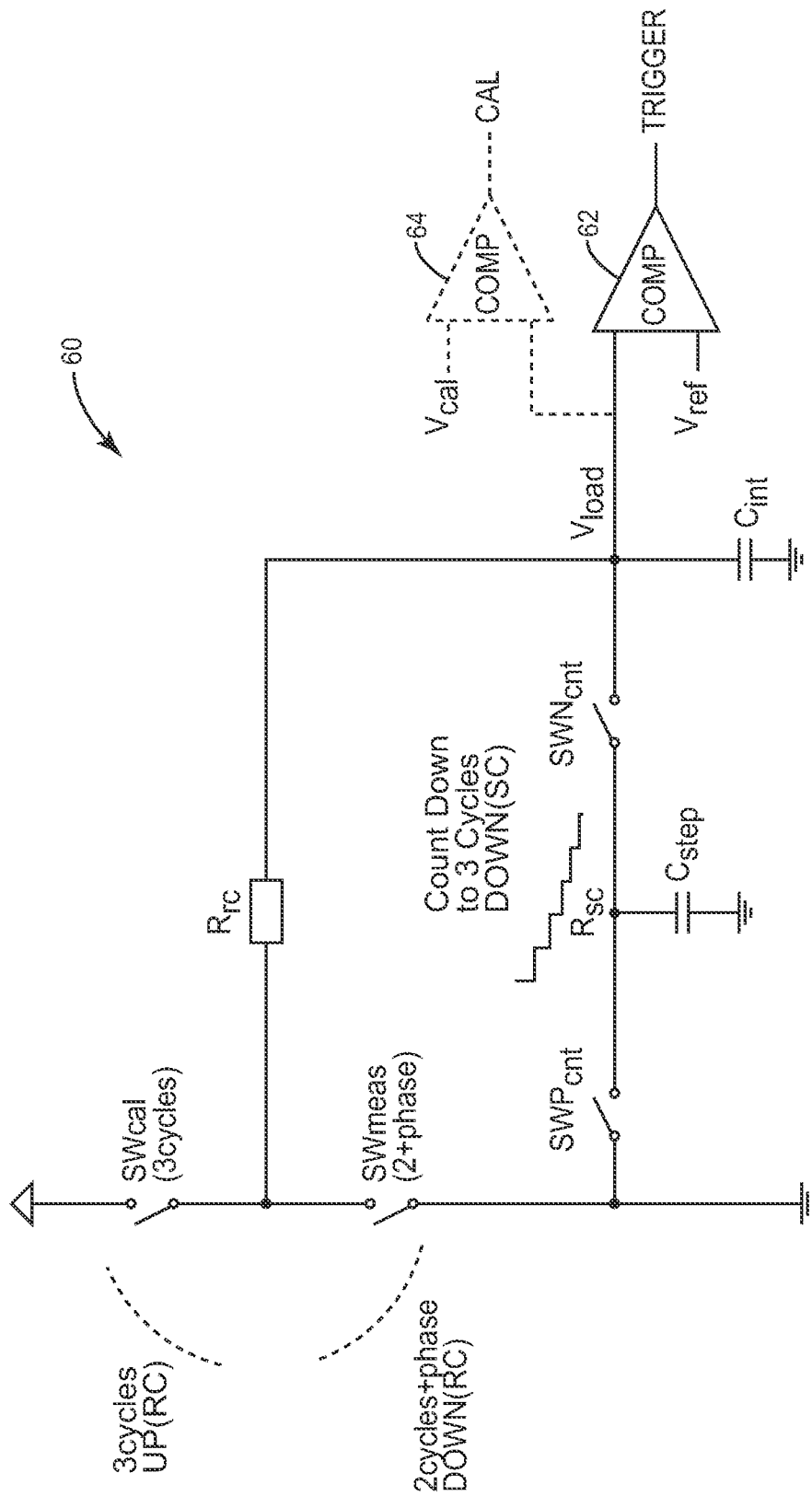
FIG. 7 is a circuit diagram of an NCDT according to another embodiment.

FIG. 7 depicts an NCDT circuit 60 according to this embodiment. The basic concept is similar to the embodiment of FIG. 4, and the equations are the same; however the analog and digital domain operations combined in a different way. This Implementation finds particular utility in PLL applications, where the phase of the DCO clock is measured once in every reference (REF) period.

A comparator 62 is used to compare voltage $V_{load}$ to a predetermined reference voltage $V_{ref}$. Another comparator 64 may be used to compare the voltage $V_{load}$ to a pre-defined calibration voltage level $V_{cal}$ in a calibration procedure to set an initial value for $V_{load}$. The circuit 60 includes a single integration capacitor $C_{int}$. The integration capacitor $C_{int}$ is charged, through the resistor $R_{rc}$, for an analog charging duration, and discharged for a (shorter) analog discharge duration. The integration capacitor $C_{int}$ is then further discharged in a digital fashion. In particular, the analog charging duration is performed at the end of a prior cycle. The integration capacitor $C_{int}$ is charged from a voltage at or near $V_{ref}$ by closing the switch $SW_{cal}$ for a predetermined, integral number of clock cycles, (such as the DCO signal). This imparts a discrete quantum of charge to the integration capacitor $C_{int}$.

The measurement begins at a rising edge of the reference signal REF(UP), when the integration capacitor $C_{int}$ is discharged, by closing the switch $SW_{meas}$, for an analog discharge duration that lasts until a predetermined following edge of the DCO clocking signal. The number of DCO clock cycles in the analog discharge duration is at least one less than during the analog charging duration. The analog discharge duration thus include an integral number of clock cycles, and the delay, or phase error, between the reference signal edge and a clock cycle edge. Charge is then removed from the integration capacitor $C_{int}$ in the digital domain via the digitally switched capacitor $C_{step}$ and switches $SWP_{cnt}$ and $SWN_{cnt}$, until $V_{load}$ decays to $V_{ref}$ and the cycles are counted. The digital count may include discharge over one or more DCO cycles, and also includes the difference between the phase error and a full DCO cycle. The phase error may thus easily be determined from the digital discharge count N.

Figure 8:
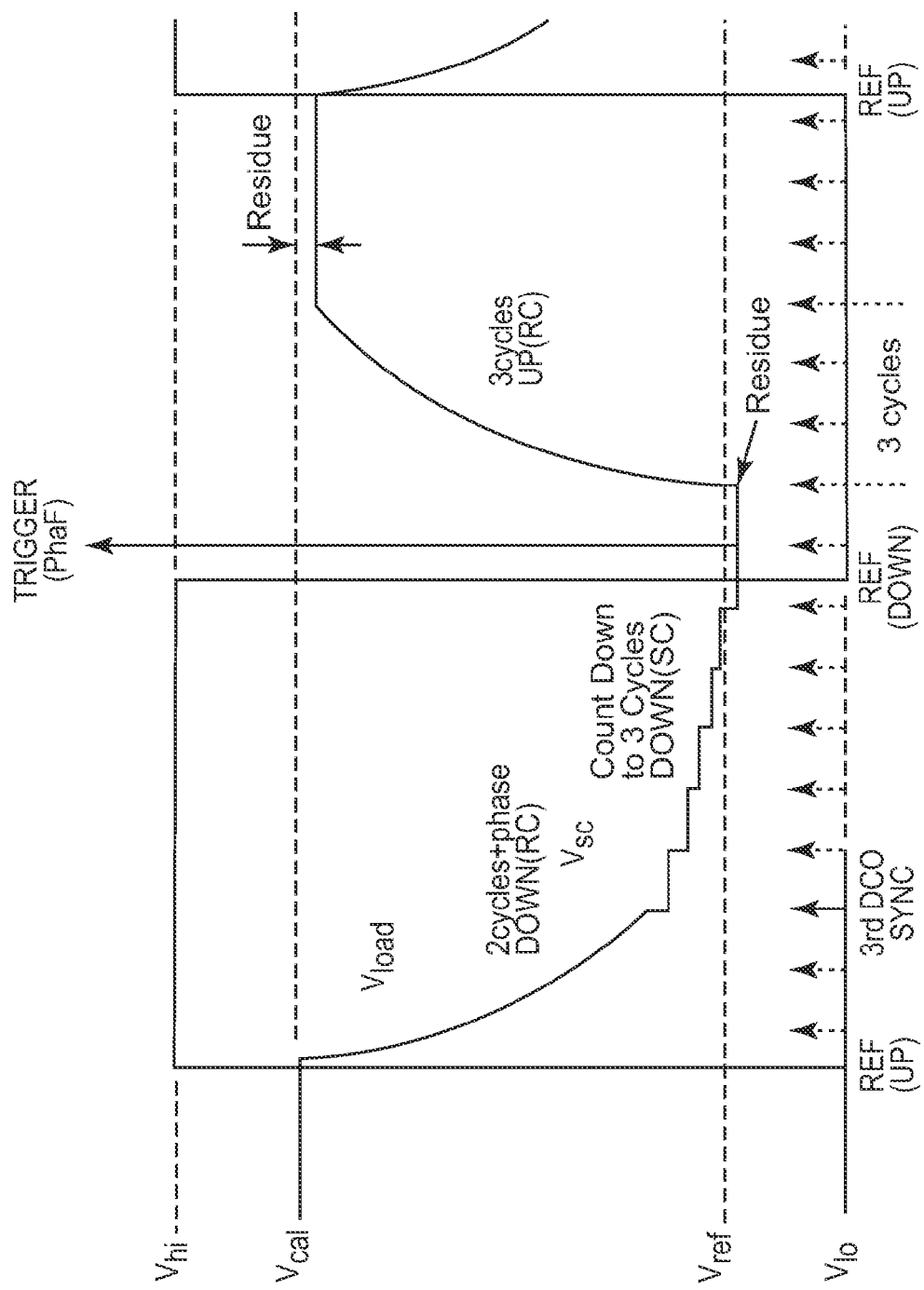
FIG. 8 is a graph of waveforms of the circuit of FIG. 7.

FIG. 8 depicts the $V_{load}$ curve. Initially, the integration capacitor $C_{int}$ is charged to a calibration voltage level $V_{cal}$, and the switches $SW_{cal}$ and $SW_{meas}$ are both open. Beginning at a rising edge of the reference signal REF(UP), $SW_{meas}$ closes and the integration capacitor $C_{int}$ is exponentially discharged by an RC time constant formed by resistor $R_{rc}$ and the integration capacitor $C_{int}$. The switch $SW_{meas}$ is opened on a DCO clock edge following a predetermined number of cycles. In the embodiment of FIG. 8, the switch $SW_{meas}$ is opened on the third DCO clock following the REF(UP) edge. This timing is selected because the circuits are known to be stable enough, even when an edge of the DCO clock coincides exactly with the REF clock edge. In other words, including an integral number of DCO clock cycles in the analog discharge duration lowers the possibility for meta-stability.

The switch $SW_{meas}$ is closed for $T_{meas}$, which includes, in this case, two DCO clock cycles and the phase error, which depends on the relative phasing of REF and DCO clocks. The integration capacitor $C_{int}$ is then further discharged by stepping $V_{load}$ exponentially lower towards $V_{lo}$ by using SC circuitry formed by the digitally switched capacitor $C_{step}$ and switches $SWP_{cnt}$ and $SWN_{cnt}$. Because the $C_{step} \ll C_{int}$, the discharge of the relatively small remaining charge in $C_{int}$ takes several DCO clock cycles, which are counted. As soon as $V_{load}$ reaches $V_{ref}$ level, the comparator 62 outputs a TRIGGER signal and digital count value is stored. The phase error between the reference and DCO signals is then calculated.

Figure 9:
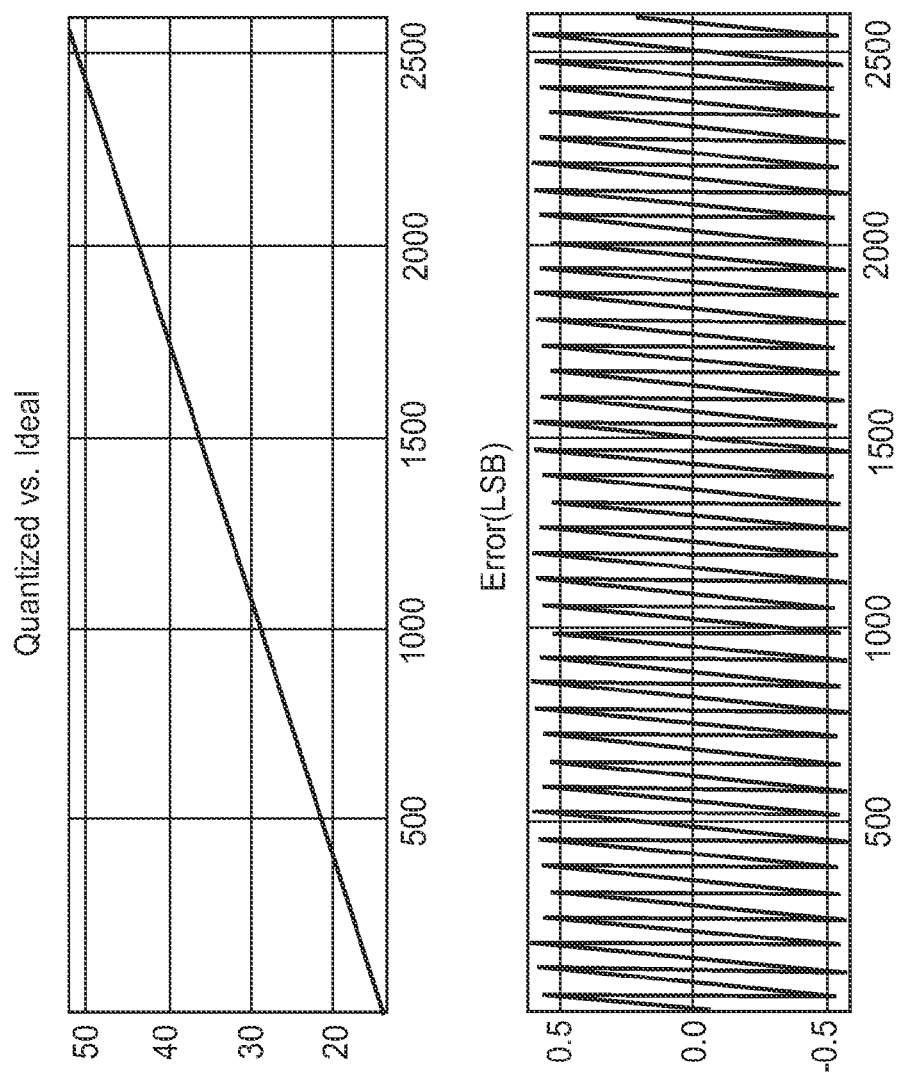
FIG. 9 depicts graphs of quantized phase and LSB error for the circuit of FIG. 7.

Thus, during each measurement cycle, $V_{load}$ decreases for a total of three DCO cycles (the sum of the analog discharge duration and digital discharge count), and increases for three DCO cycles (the analog charging duration). Again, due to exponential shape of the analog and digital charge/discharge curves, the conversion from $T_{meas}$ to PhaF is fully linear, as shown by simulation data in FIG. 9.

Note that initially, the integration capacitor $C_{int}$ is charged such that the voltage $V_{load}$ is equal to a predetermined voltage level $V_{cal}$, such as by closing the switch $SW_{cal}$ until the comparator 64 indicates that $V_{load}=V_{cal}$. Once this predetermined voltage level $V_{cal}$ is reached, the discharging of the integration capacitor $C_{int}$ is determined by DCO clock counts and the lower voltage threshold $V_{ref}$, and subsequent charging of $C_{int}$ is determined entirely by DCO clock counts.

The graph of FIG. 8 describes the operation of the NCDT circuit 60 of FIG. 7 when $T_{meas}=T_{stop}-T_{start}$ is a phase difference between two periodic signals—in this case, a reference clock signal and the DCO output. In this case, the higher frequency signal (i.e., the DCO output) is used to clock the switched capacitor circuit to remove charge from the integration capacitance $C_{int}$ during the discrete discharge cycles following the analog discharge duration. In general, the digital clock need not be related to one of the signals defining $T_{meas}$.

Figure 10:
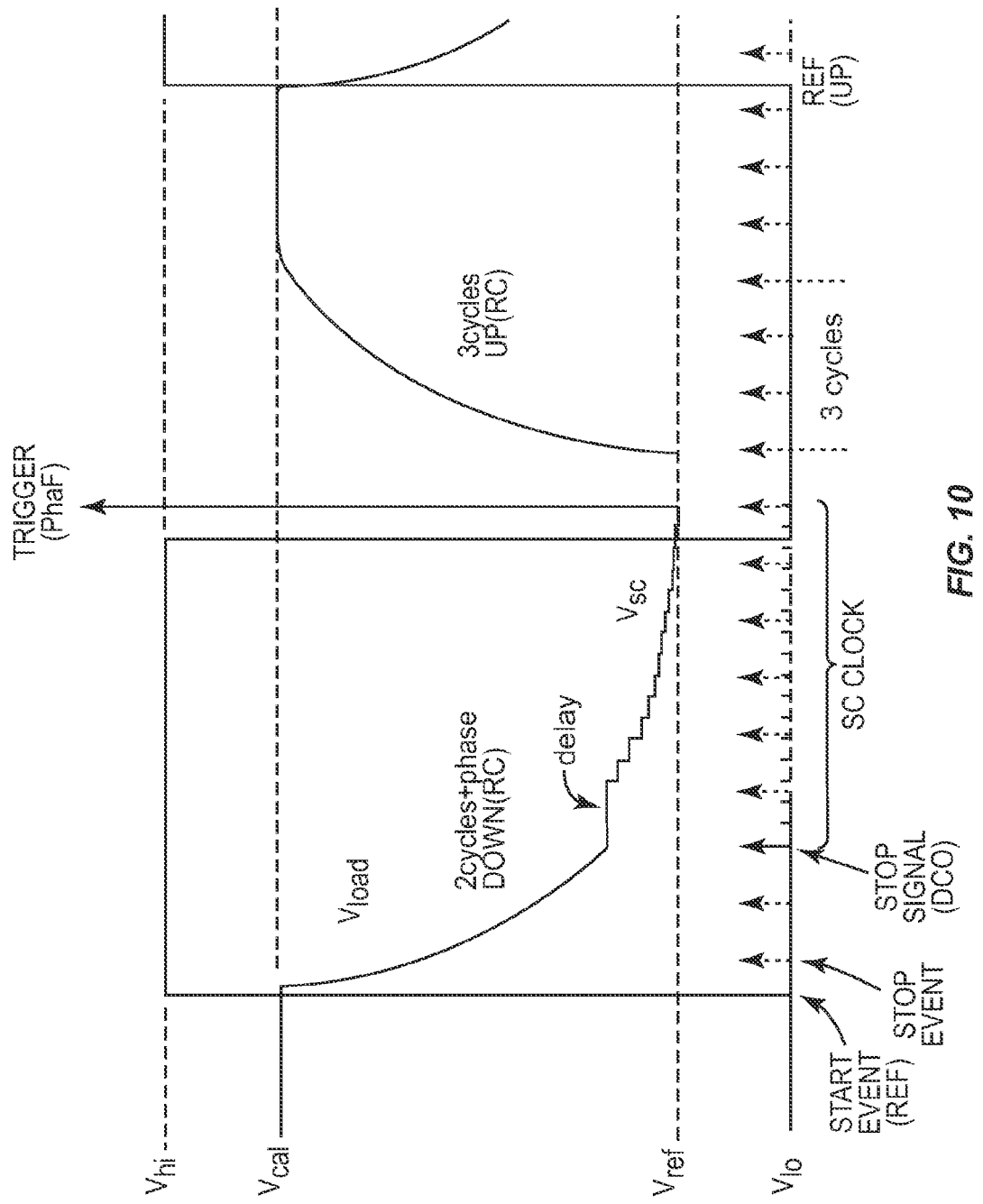
FIG. 10 is a graph of waveforms of the circuit of FIG. 7 when a separate digital clock is employed.

FIG. 10 depicts an embodiment wherein the switched capacitor circuit is clocked by an independent SC CLOCK signal. In this case, as before, the analog discharge duration begins with a START signal (e.g., an edge of the reference clock signal), and ends with a STOP signal (e.g., an edge of the DCO output, which is preferably not the immediately following edge, or actual STOP event, to avoid metastability issues, as discussed above). In this embodiment, the STOP signal also enables an SC CLOCK signal, which clocks the digitally switched capacitor $C_{step}$. The switched capacitor $C_{step}$ discharges the integration capacitance $C_{int}$ in discrete steps, until the comparator 62 detects that the load voltage $V_{load}$ is equal to or less than the reference voltage $V_{ref}$. The number N of discrete discharge cycles is counted. As long as charge sharing between $C_{int}$ and $C_{step}$ is complete in every cycle, the conversion result is independent of the clock rate used for the discrete discharge cycles.

Note that, as depicted in FIG. 10, the switching of the capacitor $C_{step}$ may be delayed from the STOP signal (in the case depicted, by three SC CLOCK cycles), such as to enable or initialize a counter, or for other reasons. Since the elapsed time $T_{meas}=T_{stop}-T_{start}$ is being measured in the voltage domain (via the charge on $C_{int}$), a delay in the time domain does not affect the measurement.

The use of an independent SC CLOCK signal is particularly advantageous when the DCO output frequency is relatively low, as it results in higher resolution. For example, if the DCO signal is twice the frequency of the reference signal, then an SC CLOCK signal may be selected to be 100× the reference signal frequency. For example, if REF=26 MHz and DCO≅52 MHz, then SC_CLOCK□5 GHz. In applications where a 100× clock may not be practical, a multi-phase ring oscillator can be used. For example, a 10× frequency, 10 phase oscillator results in 100× oversampling. That is, SC_CLOCK□500 MHz with 10 phases, resulting in a 5 GHz effective sampling frequency.

It is apparent from FIG. 10 that the START and STOP events need not even be edges of periodic signals at all. For example, the START and STOP events could be two related but independent events, such as measuring the "time of flight" in laser telemetry. As another example, the START and STOP events could be two unrelated events, such as outputs from transducers (e.g., gamma ray detectors, or the like). In general, embodiments of the present invention may be advantageous in measuring any short time durations, marked by detectable events, with high accuracy.

In these general cases, a second periodic signal (the DCO clock in the Figures) would be enabled by detection of the STOP event. The analog discharge duration would comprise the elapsed time between the START and STOP events, $T_{meas}=T_{stop}-T_{start}$, plus some integral number of cycles of this second periodic signal. Following the analog discharge duration—either immediately (FIG. 8) or after some delay (FIG. 10)—either the second periodic signal (FIG. 8) or an independent SC CLOCK (FIG. 10) would further discharge the integration capacitance $C_{int}$. The second periodic signal would continue to run through the analog charging duration (which would comprise an integral number of cycles of the second periodic signal, at least one cycle more than the analog discharge duration). Accordingly, althoughly primarily described herein as a phase error detector applicable to a DPLL, the present invention is not limited to that application. Rather, embodiments of the present invention may be advantageously deployed to measure very short durations defined by any detectable START and STOP events, with high accuracy and by utilizing simple and imprecise (hence inexpensive) circuit components.

Although not depicted in FIG. 10, a residual charge may remain in the integration capacitance $C_{int}$, as discussed above with respect to FIG. 8. Generally, the residual charge will be lower, since the higher-frequency SC CLOCK means that there will be less quantization error due to mismatches between $V_{load}$ and $V_{cal}$.

The different embodiments of the present invention described above—for example, those whose operation is depicted in FIGS. 8 and 10 (and FIGS. 14, 16, and 17, described below)—may be implemented, using the circuit of FIG. 7 or straightforward variants thereof, by altering the operation of a controller (not shown in the figures). Such a controller may be implemented as a state machine in hardware, in programmable logic via appropriate firmware, or as a programmable microprocessor or Digital Signal Processor (DSP) via appropriate software. Such control implementation may readily be designed and implemented by those of skill in the electronic arts, given the teachings of the present disclosure. Similarly, the implementation of an SC CLOCK signal, with concomitant gating for selective enablement as described above, is well understood by those of skill in the art.

One important aspect of numerous embodiments of the present invention is the use of noise shaping to enhance resolution, by retaining residual charge in $C_{int}$ between measurement cycles. The NCDT circuit 60 of FIG. 7 measures the time $T_{meas}$ from a reference clock edge to a DCO clock edge by charging a capacitor $C_{int}$ from a voltage level at or near $V_{ref}$ for three DCO cycles (analog charging duration), discharging $C_{int}$ for two DCO cycles and a phase error (analog charging duration), and then counting the digital cycles to discharge $C_{int}$ back to $V_{ref}$. Note that there is no reset circuitry (i.e., no ZERO signal) to discharge the integration capacitor $C_{int}$ between measurement cycles, as depicted in FIG. 8. Thus, any difference between the actual $V_{load}$ and $V_{ref}$ is retained between measurement cycles. $T_{meas}$ is derived from applying and removing quanta of charge, not by measuring absolute voltage levels. Accordingly, the discrepancy between $V_{load}$ and $V_{ref}$ does not introduce a quantization error into the digital discharge count, and hence into the calculation of $T_{meas}$.

As indicated in FIG. 8, a residual charge retained in $C_{int}$ gives rise to a residual voltage (digital error remainder), which is stored between cycles. This effectively this shapes the quantization noise, as described in Equation 8 (see also, Chun-Ming Hsu et al.).

$$e[k]=q[k]-q[k-1] \quad (8)$$

The converter quantization noise is thus shaped by first order noise shaping, due to the feature of retaining residual charge, and hence voltage, leading to greater resolution (at least long term, by means of averaging, which is what the DPLL loop-filter does).

Figure 11:
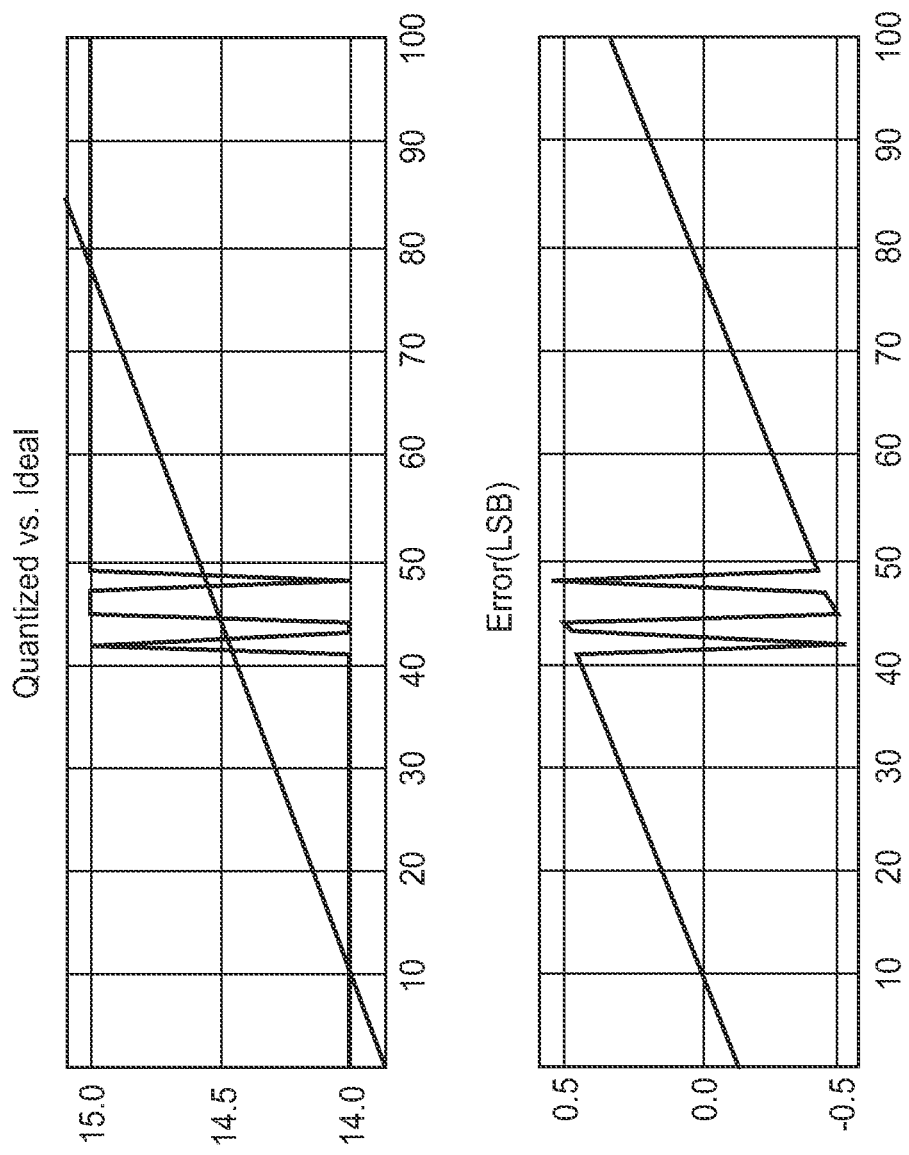
FIG. 11 depicts graphs showing noise shaping for the circuit of FIG. 7.

FIG. 11 depicts the noise shaping in one LSB step in PhaF (from 14 to 15). Instead of having straightaway transition from 14 to 15, there is a pulse-width modulation PWM in transition, due to residue. Effectively this improves the quantization noise at lower frequencies, and pushes quantization noise towards the half of the sampling frequency, far outside the DPLL loop bandwidth. The noise is thus shaped "out-of-band."

Figure 12:
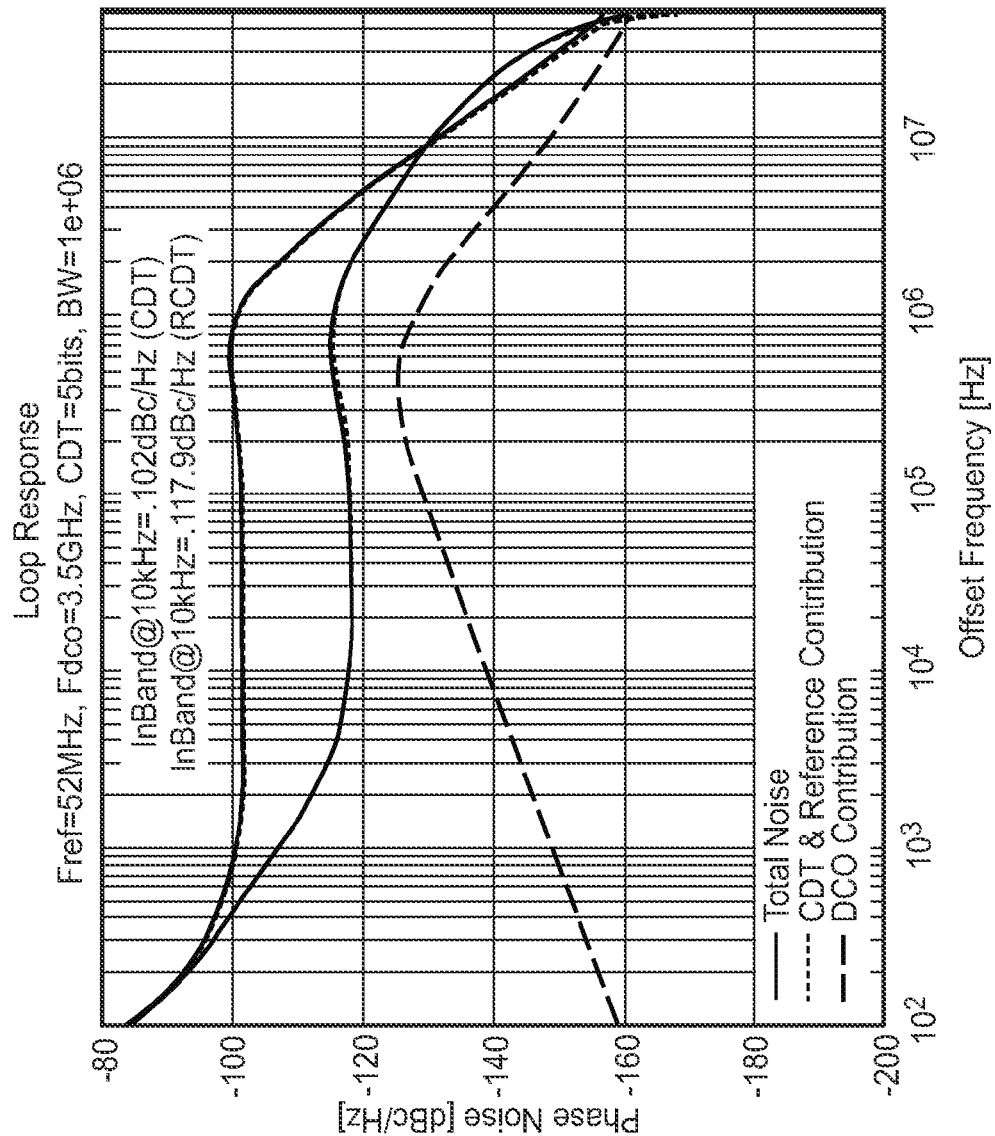
FIG. 12 is a graph of phase noise contributions for the circuit of FIG. 7.

FIG. 12 depicts the phase noise of various Charge-to-Digital Timer circuits at PLL operating frequencies, according to simulations. The noise shaping yields a significant improvement for in-band noise. In-band noise level for a converter without noise shaping (CDT/RCDT 50) is around −102 dBc/Hz, whereas the noise shaping (NCDT 60) pushes noise towards half of the sampling frequency (26 MHz), and in-band level is around −118 dBc/Hz. This improvement in the noise level can manifest directly in local oscillator (LO) quality and thus also in RX/TX signal quality. Note, however, that these results are from simulations; in actual systems, in-band noise level of −118 dBc/Hz (and out-of-band noise level of −155 dBc/Hz) is difficult to achieve due to other noise sources in the DPLL system.

Gain of the converter describes how the converter output changes with the input. For the TDC $$\text{Gain} = \frac{\Delta PhaF}{\Delta T_{meas}}.$$

Converter gain must be known and/or calibrated for proper operation as a part of system (i.e. PLL).

The NCDT circuit 60 can be calibrated in various ways. In addition to methods for CDT calibration as described in the patent application Ser. No. 13/338,550, titled "Calibration of a Charge-to-Digital Timer," filed Dec. 28, 2011, and incorporated herein by reference, also other calibration methods can be utilized with NCDT.

In one embodiment, calibration is based on $R_{rc}$ vs. $R_{sc}$. If $C_{int}$ is kept the same, the relationship between $R_{rc}$ in equation (2) and $R_{sc}$ in equation (3) is directly the conversion gain from the analog time domain to the digital time domain—i.e. the gain of the converter.

Relationship between $T_{analog}$ and $T_{digital}$ is directly controlled by the ratio of $R_{rc}$ and $R_{sc}$. For example, in the PLL application when $CLK_{cnt}$ is derived directly from the measured signal (DCO clock), one cycle in the analog domain corresponds to $R_{sc}/R_{rc}$ cycles in the digital domain. As one specific example, when $T_{step}=200$ pico seconds, $C_{step}=10$ fF, and $R_{rc}=500\Omega$, the scaling factor between digital and analog domains (converter gain) is thus $$\text{Gain} = \frac{R_{sc}}{R_{rc}} = \frac{\frac{T_{step}}{C_{step}}}{R_{rc}} = 40.$$

Figure 13:
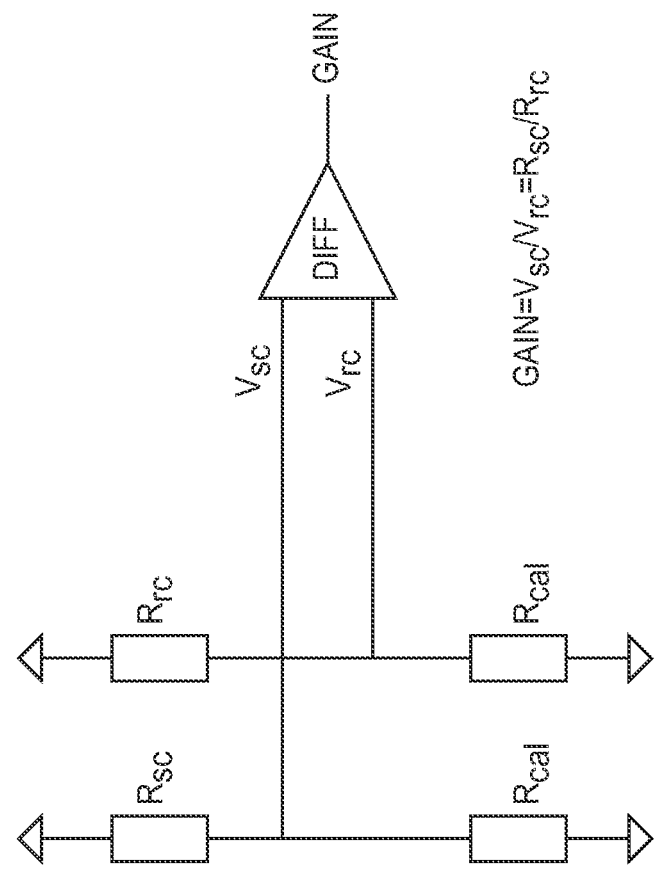
FIG. 13 a circuit diagram of one calibration circuit for the circuit of FIG. 7.

$R_{sc}$ and $R_{rc}$ can be compared in numerous ways. FIG. 13 depicts one example. The ratio between $R_{sc}$ and $R_{rc}$ is measured with differential amplifier, by using voltages $V_{sc}$ and $V_{rc}$, voltages $V_{sc}$ and $V_{rc}$ are generated by using resistors $R_{sc}$, $R_{rc}$, and $R_{cal}$.

Figure 14:
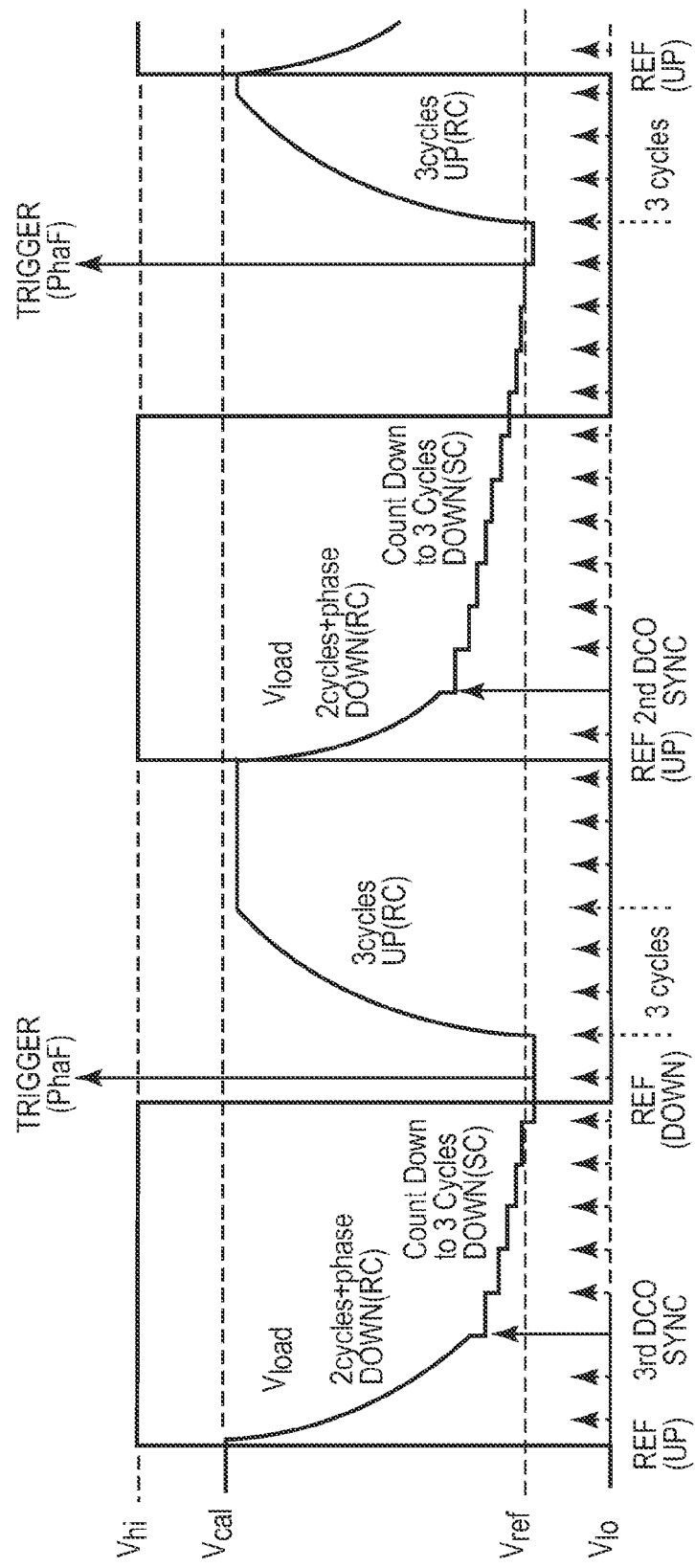
FIG. 14 is a graph of waveforms depicting one method of calibration of the circuit of FIG. 7.

In another embodiment, the calibration is based on cycles. The NCDT circuit 60 of FIG. 7 can be easily modified to include cycle calibration. Instead of one analog discharge duration always proceeding from the reference clock edge REF(UP) to the $3^{rd}$ following DCO clock edge, a different DCO edge can alternately be used. For example, in one embodiment, every other measurement cycle uses an abbreviated analog discharge duration defined from the reference clock edge REF(UP) to the $2^{nd}$ following DCO clock edge. In this case, the $V_{load}$ waveforms are depicted in FIG. 14. When PhaF is monitored, the cycle variation at every second sample (REF clock edge) can be seen as PhaF variation. This variation is detected, and it translates directly into one DCO cycle in digital domain—i.e. the gain of the converter.

Figure 15:
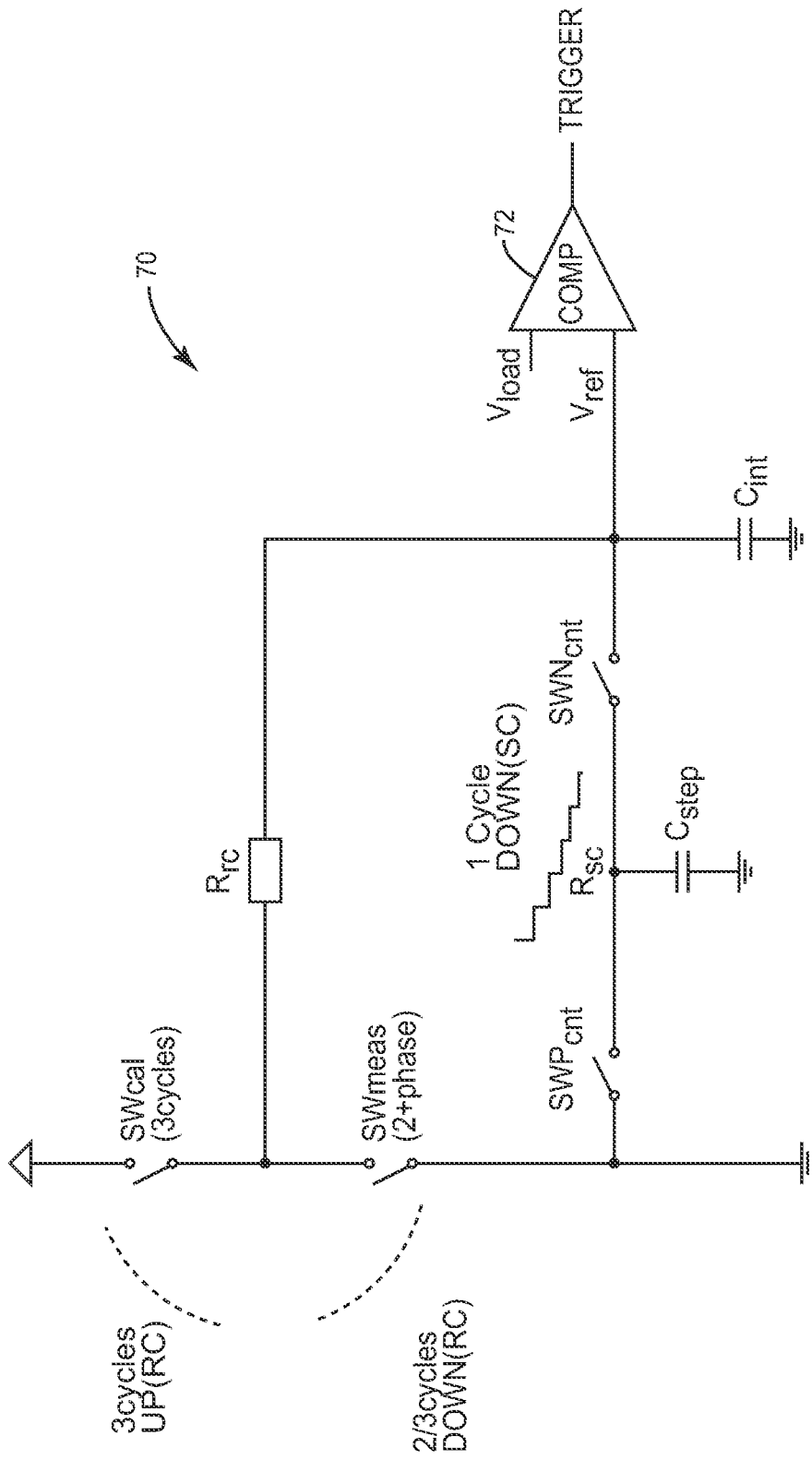
FIG. 15 is a circuit diagram of an NCDT according to yet another embodiment.

In yet another embodiment, depicted in FIG. 15, the calibration is based on a differential cycle. Rather than using a fixed $V_{ref}$ as in the NCDT circuit 60 depicted in FIG. 7, $V_{ref}$ is instead generated using similar circuitry and functionality as for $V_{load}$.

Figure 16:
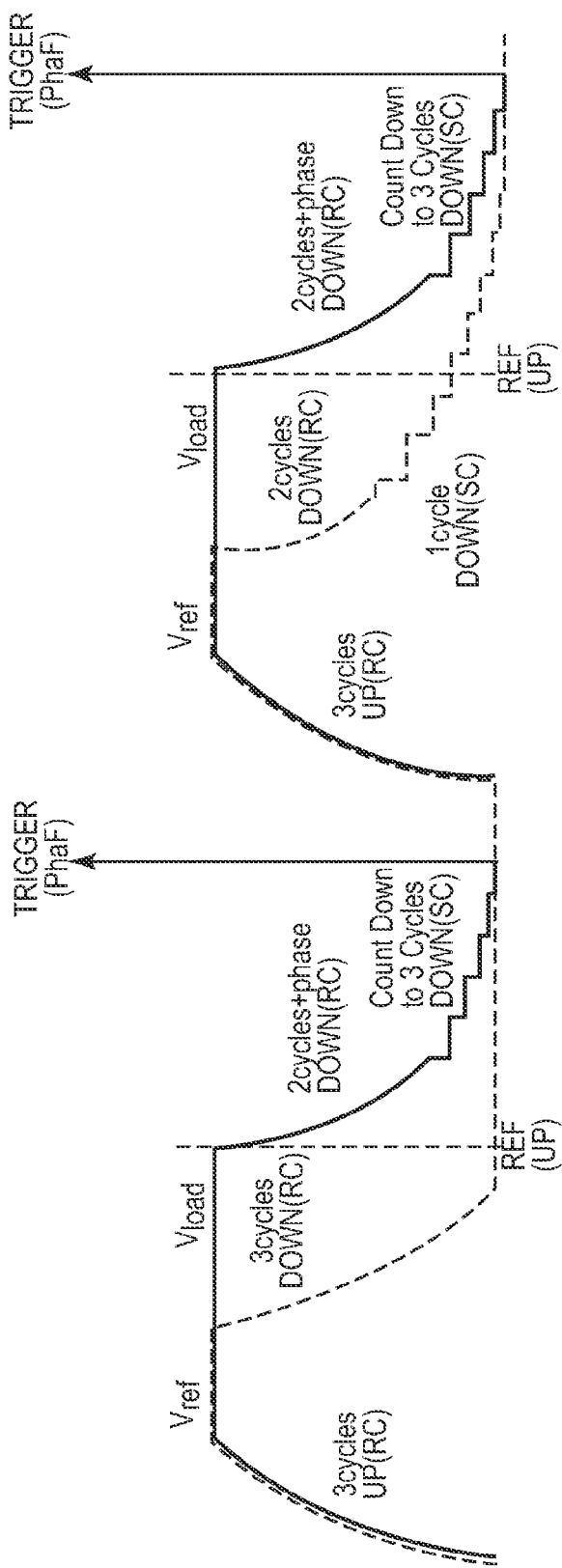
FIG. 16 is a graph of waveforms of the circuit of FIG. 14.

FIG. 16 depicts the waveforms for this embodiment. $V_{load}$ circuitry (not shown in FIG. 14) is the same as depicted in FIG. 7, and it functions as depicted in FIG. 8. However, in this embodiment, rather than a constant $V_{ref}$, $V_{ref}$ is loaded up/down similarly to $V_{load}$, except that $V_{ref}$ contains information only from full DCO cycles, whereas the $V_{load}$ also includes information of $T_{meas}$ (i.e., the phase error). $V_{ref}$ increases during an analog charging duration of three DCO cycles, just as $V_{load}$. $V_{ref}$ decreases, in alternate measurement cycles, with either an analog discharge duration of three DCO cycles, or an abbreviated analog discharge duration of two DCO cycles, and discrete discharging via the RC circuits for the charge associated with one DCO cycle. As described above, variation in PhaF is detected and thus the difference (converter gain) between one cycle in RC and one cycle in SC is obtained.

The three embodiments described above are representative examples of different RCDT/NCDT calibration methods. Those of skill in the art, given the teachings of the present disclosure, may readily devise other calibration methods. In the calibration, the primary concern is to ascertain the relationship between the discrete-time (SC) and continuous-time (RC), or analog, domains. Methods to achieve this are not limited to the specific embodiments described herein.

Figure 17:
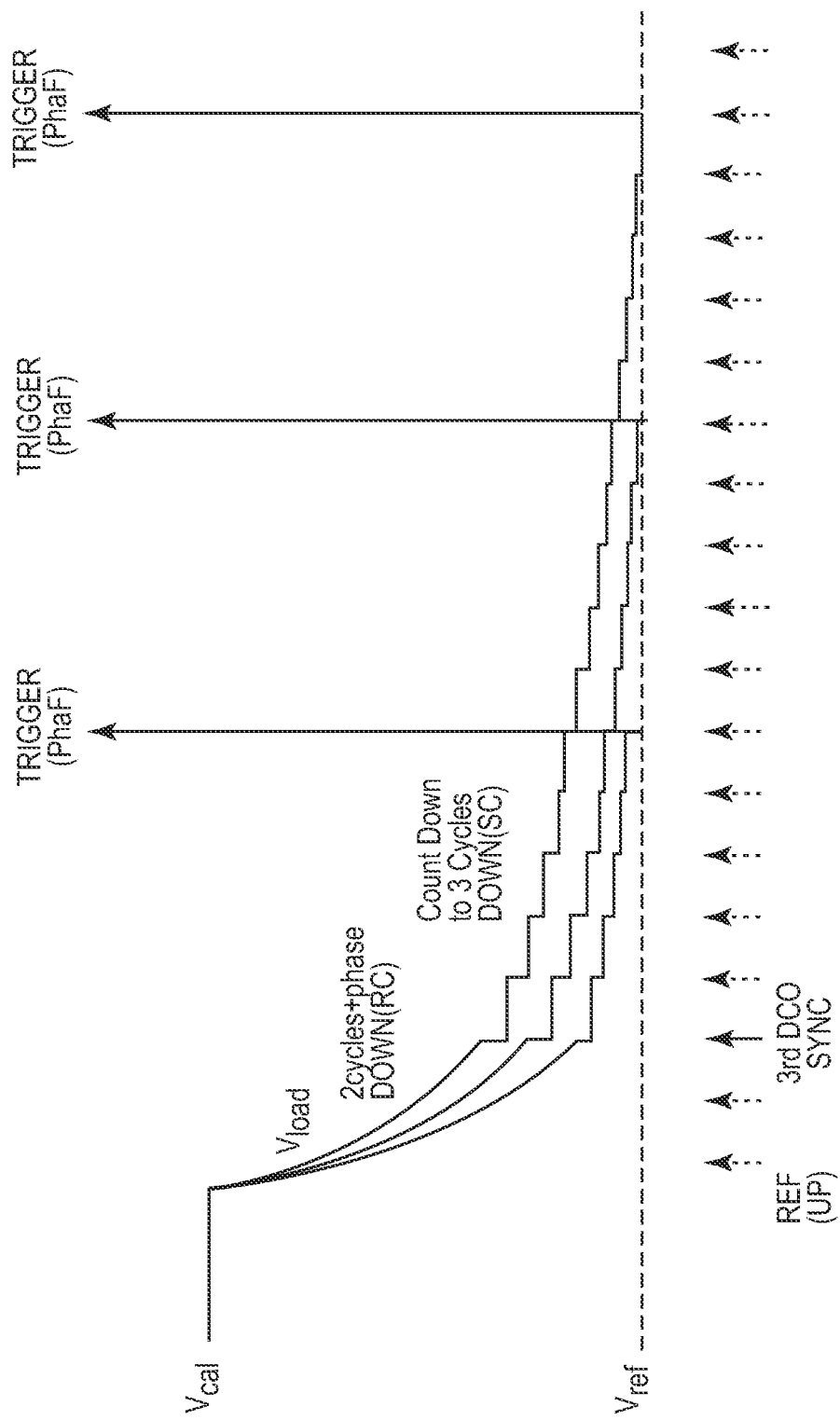
FIG. 17 is a graph of waveforms of the circuit of FIG. 14 featuring modulation/dither by changing the integration capacitor.

Other extensions and modifications can also be considered for the RCDT and NCDT types of TDC, and their operation. One example is shown in FIG. 17. In this embodiment, the integration capacitor $C_{int}$ is changed over three different values. This yields three different outputs for PhaF. Changing $C_{int}$ can be used to emulate the change in $T_{analog}$. Referring to equation (2), $T_{analog}/R_{rc}C_{int}$ appears in the exponent. This means that linear modulation or dithering can be added into the system simply by changing the value of $C_{int}$.

Modulation (and calibrations) can be also achieved by modifying $V_{hi}$, $V_{lo}$, $V_{ref}$ and circuit components (R*, C*, SW* and Comp) with a certain sequence in time. In general, linear and optionally noise-shaping time-to-digital converters may be formed by combining discrete-time (SC) and continuous-time (RC) domain measurements. Of course, applications of the RCDT and NCDT types of TDC are not limited into PLLs only. Rather, embodiments of the present invention may find utility in many different applications, where short $T_{meas}=T_{stop}-T_{start}$ is required with high accuracy and with simple circuits utilizing inexpensive components.

The RCDT and NCDT based TDC architectures according to embodiments of the present invention present numerous advantages over the prior art. They exhibit low supply current peaking and good DC power efficiency. Since the current peaks are well controlled, the interference level caused by the phase detection to the DCO is lower. Also, the low current peaking enables well-stabilized voltages and thus accurate characterization measurements for the phase quantization analog parts. The measurement results can be used to optimize the phase detection accuracy and thus the performance of a DPLL. Additionally, DC current consumption does not rise with the input frequency to the extent seen in delay cell based TDC design. The RCDT/NCDT also exhibits good measurement accuracy tunability over the required frequency range and in varying environments; good linearity; and high accuracy with noise-shaping. The circuits 50, 60, 70 are small, simple, feasible with current technology, and do not require extensive component precision or matching.

Other references incorporated herein by reference include the papers by Ian Galton, titled, "Analog-Input Digital Phase-Locked Loops for Precise Frequency and Phase Demodulation," published in the *IEEE Transactions on Circuits and Systems*, Vol. 42, No. 10, pp. 621-630, October 1995, and by Pasquale Napolitano et al., titled, "A Novel Sample-and-Hold-Based Time-to-Digital Converter Architecture," published in the *IEEE Transactions on Instrumentation and Measurement*, Vol. 59, No. 5, pp. 1019-1026, May. 2010.

The present invention may, of course, be carried out in other ways than those specifically set forth herein without departing from essential characteristics of the invention. The present embodiments are to be considered in all respects as illustrative and not restrictive.

What is claimed is:

1. A method of measuring the elapsed time between a START event and a later STOP event, comprising:
   comparing a load voltage across an integration capacitance to a predetermined reference voltage;
   beginning at the START event, continuously discharging the integration capacitance through a resistor for an analog discharge duration lasting at least until the STOP event to reduce the load voltage;
   following the analog discharge duration, discharging the integration capacitance in a plurality of discrete discharge cycles via a digitally switched capacitance that is a predetermined fraction of the integration capacitance, to further reduce the load voltage, until the load voltage is equal to or less than the reference voltage;
   counting the number of discrete discharge cycles; and
   continuously charging the integration capacitance through the resistor for a predetermined analog charging duration, greater than the analog discharge duration, to increase the load voltage;
   wherein the elapsed time is determined from the number of discrete discharge cycles.

2. The method of claim 1 further comprising enabling a second periodic signal upon the STOP event, the second periodic signal remaining enabled at least through the analog charging duration.

3. The method of claim 2 wherein the analog discharge duration comprises the elapsed time and a first integral number of cycles of the second periodic signal, and wherein the analog charging duration comprises a second, greater number of cycles of the second periodic signal.

4. The method of claim 3 wherein the digitally switched capacitance is switched to reduce the load voltage in discrete steps by the second periodic signal.

5. The method of claim 3 wherein the digitally switched capacitance is switched to reduce the load voltage in discrete steps by a third periodic signal having a higher frequency than the second periodic signal, wherein the third periodic signal is enabled upon the START event and remains enabled at least until the load voltage is equal to or less than the reference voltage.

6. The method of claim 4 wherein the START event is a transition of a first periodic signal having a lower frequency than the second periodic signal, and the elapsed time is a phase difference between the first and second periodic signals.

7. The method of claim 6 further comprising repeating the method steps for each of a plurality of measurement cycles.

8. The method of claim 7 further comprising, for the first measurement cycle only, initially charging the integration capacitance to increase the load voltage to a predetermined calibration voltage.

9. The method of claim 8 wherein the number of discrete discharge cycles indicates at least the difference between the phase difference and a full cycle of the second periodic signal.

10. The method of claim 9 wherein the charge removed from the integration capacitance during the sum of the analog discharge duration and the discrete discharge cycles is substantially equal to the charge added to the integration capacitance during the analog charging duration.

11. The method of claim 10 wherein a residual charge in the integration capacitance, corresponding to an error between the load voltage and the reference voltage, is retained between measurement cycles.

12. The method of claim 11 wherein in the retention of charge implements noise shaping by reducing the quantization error caused by any difference between the load voltage and the reference voltage.

13. The method of claim 10 further comprising:
on alternate adjacent measurement cycles, continuously discharging the integration capacitance through the resistance for an abbreviated analog discharge duration, wherein the abbreviated analog discharging duration is at least one cycle of the second periodic signal less than the analog discharging duration;
comparing the numbers of discrete discharge cycles on successive measurement cycles; and
calculating a gain as a difference in the discrete discharge cycle count.

14. The method of claim 13 wherein the difference in the discrete discharge cycle count corresponds to one cycle of the second periodic signal in the digital domain.

15. The method of claim 6 further comprising calculating a gain as the ratio of one cycle of the second periodic signal to the digitally switched capacitance, divided by the resistance of the resistor.

16. The method of claim 15 wherein $$\text{Gain} = \frac{R_{sc}}{R_{rc}} = \frac{\frac{T_{step}}{C_{step}}}{R_{rc}}$$

where
$R_{rc}$ is the resistance of the resistor;
$R_{sc}$ is a resistance associated with the digitally controlled capacitance;
$T_{step}$ is the period of one cycle of the second periodic signal; and
$C_{step}$ is the digitally switched capacitance.

17. A Noise Shaping Charge to Digital Timer (NCDT) circuit operative to measure the elapsed time between a START event and a later STOP event, comprising:
an integration capacitor having a load voltage across it;
a resistor in series with the integration capacitor;
a digitally switched capacitor being a predetermined fraction of the integration capacitance;
a comparator operative to compare the load voltage to a reference voltage; and
a controller operative to
beginning at the START event, continuously discharge the integration capacitor through the resistor for an analog discharge duration lasting at least until the STOP event to reduce the load voltage;
following the analog discharge duration, discharge the integration capacitor in a plurality of discrete discharge cycles via the digitally switched capacitor, to further reduce the load voltage, until the load voltage is equal to or less than the reference voltage;
count the number of discrete discharge cycles; and
continuously charge the integration capacitor through the resistor for a predetermined analog charging duration, greater than the analog discharge duration, to increase the load voltage; and
determine the elapsed time from the number of discrete discharge cycles.

18. The circuit of claim 17 wherein the controller is further operative to enable a second periodic signal upon the STOP event, the second periodic signal remaining enabled at least through the analog charging duration.

19. The circuit of claim 18 wherein the analog discharge duration comprises the elapsed time and a first integral number of cycles of the second periodic signal, and wherein the analog charging duration comprises a second, greater number of cycles of the second periodic signal.

20. The circuit of claim 19 wherein the digitally switched capacitance is switched to reduce the load voltage in discrete steps by the second periodic signal.

21. The circuit of claim 19 wherein the digitally switched capacitance is switched to reduce the load voltage in discrete steps by a third periodic signal having a higher frequency than the second periodic signal, wherein the third periodic signal is enabled upon or following the STOP event and remains enabled at least until the load voltage is equal to or less than the reference voltage.

22. The circuit of claim 20 wherein the START event is a transition of a first periodic signal having a lower frequency than the second periodic signal, and the elapsed time is a phase difference between the first and second periodic signals.

23. The circuit of claim 22 wherein the controller is further operative to repeat the steps for each of a plurality of measurement cycles.

24. The circuit of claim 23 wherein the controller is further operative to, for the first measurement cycle only, initially charge the integration capacitance to increase the load voltage to a predetermined calibration voltage.

25. The circuit of claim 24 wherein the analog discharge duration comprises at least one cycle of the second periodic signal and the phase difference.

26. The circuit of claim 25 wherein the number of discrete discharge cycles indicates at least the difference between the phase difference and a full cycle of the second periodic signal.

27. The circuit of claim 26 wherein the charge removed from the integration capacitance during the sum of the analog discharge duration and the discrete discharge cycles is substantially equal to the charge added to the integration capacitance during the analog charging duration.

28. The circuit of claim 27 wherein a residual charge in the integration capacitance, corresponding to an error between the load voltage and the reference voltage, is retained between measurement cycles.

29. The circuit of claim 28 wherein in the retention of charge implements noise shaping by reducing the quantization error caused by any difference between the load voltage and the reference voltage.

30. The circuit of claim 24 wherein the controller is further operative to:
on alternate adjacent measurement cycles, continuously discharge the integration capacitor through the resistor for an abbreviated analog discharge duration, wherein the abbreviated analog discharging duration is at least one cycle of the second periodic signal less than the analog discharging duration;
compare the numbers of discrete discharge cycles on successive measurement cycles; and
calculate a gain of the circuit as a difference in the discrete discharge cycle count.

31. The circuit of claim 30 wherein the difference in the discrete discharge cycle count corresponds to one cycle of the second periodic signal in the digital domain.

32. The circuit of claim 22 wherein the controller is further operative to calculate a gain as the ratio of one cycle of the second periodic signal to the digitally switched capacitance, divided by the resistance of the resistor.

33. The circuit of claim 32 wherein $$\text{Gain} = \frac{R_{sc}}{R_{rc}} = \frac{\frac{T_{step}}{C_{step}}}{R_{rc}}$$

where
$R_{rc}$ is the resistance of the resistor;
$R_{sc}$ is a resistance associated with the digitally switched capacitor;
$T_{step}$ is the period of one cycle of the second periodic signal; and
$C_{step}$ is the capacitance of the digitally switched capacitor.

34. A method of measuring the elapsed time between a START event and an edge of a periodic signal, comprising:
beginning at the START event, continuously charging an integration capacitance through a resistor for a predetermined analog charging duration comprising an integral number of cycles of the periodic signal, to increase an RC voltage across the integration capacitance;
following the analog charging duration, charging a digitally switched capacitance in a plurality of discrete charging cycles, to increase an SC voltage across the digitally switched capacitance, until the SC voltage is equal to or greater than the RC voltage; and
counting the number of discrete charging cycles;
wherein the elapsed time is determined from the number of discrete charging cycles.

35. A Resistive Charge to Digital Timer (RCDT) circuit operative to measure the elapsed time between a START event and an edge of a periodic signal, comprising:
a first integration capacitor in series with a resistor and developing an RC voltage across it;
a second integration capacitor switchably in parallel with a digitally switched capacitor, the second integration capacitor developing an SC voltage across it;
a comparator operative to compare the RC voltage to a SC voltage;
a clock source outputting a periodic signal; and
a controller operative to
beginning at the START event, continuously charge the first integration capacitance through the resistor for a predetermined analog charging duration comprising an integral number of cycles of the periodic signal, to increase the RC voltage;
following the analog charging duration, charge the second integration capacitance via the digitally switched capacitor in a plurality of discrete charging cycles, to increase the SC voltage, until the SC voltage is equal to or greater than the RC voltage; and
count the number of discrete discharge cycles;
determine the elapsed time from the number of discrete discharge cycles.

* * * * *